(12) United States Patent
Shibata

(10) Patent No.: US 7,554,862 B2
(45) Date of Patent: Jun. 30, 2009

(54) HIGH-SPEED WRITABLE SEMICONDUCTOR MEMORY DEVICE

(75) Inventor: Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 394 days.

(21) Appl. No.: 11/609,503

(22) Filed: Dec. 12, 2006

(65) Prior Publication Data

US 2007/0147141 A1     Jun. 28, 2007

(30) Foreign Application Priority Data

Dec. 23, 2005   (JP)   ............... 2005-371125

(51) Int. Cl.
*G11C 5/14* (2006.01)
(52) U.S. Cl. ................. 365/189.09; 365/185.24; 365/185.27; 365/189.011; 365/189.11; 365/210.12
(58) Field of Classification Search ............ 365/189.09, 365/189.011, 189.11, 185.24, 185.27, 210.12
See application file for complete search history.

(56) References Cited

U.S. PATENT DOCUMENTS 6,310,374 B1 * 10/2001 Satoh et al. ............. 257/298
6,801,458 B2 * 10/2004 Sakui et al. ............. 365/185.24
7,054,195 B2 * 5/2006 Matsunaga ............. 365/185.11

FOREIGN PATENT DOCUMENTS

JP    2004-192789    7/2004

* cited by examiner

*Primary Examiner*—Anh Phung
*Assistant Examiner*—Toan Le
(74) *Attorney, Agent, or Firm*—Oblon, Spivak, McClelland, Maier & Neustadt, P.C.

(57) ABSTRACT

A memory cell array has a plurality of series connected memory cells connected to word lines and bit lines and arranged in a matrix. A select transistor selects from the word lines. A control circuit controls potentials of the word lines and bit lines in accordance with input data, and controls a data write operation, a data read operation, and a data erase operation executed on the memory cells. The select transistor is formed on a substrate. For a read operation, the substrate is supplied with a first negative voltage, a selected word line is supplied with a first voltage (first voltage≧first negative voltage), and unselected word lines are supplied with a second voltage.

20 Claims, 20 Drawing Sheets

FIG. 2B (Present invention)

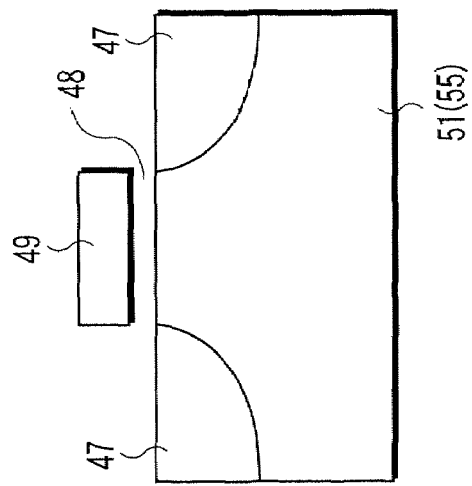

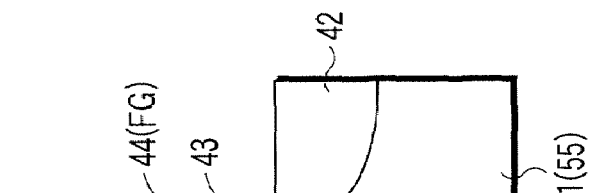

| | Cell | | H.V.NTr (P-Sub, Row decoder, a part of data storage circuit and peripheral circuit) | L.V.NTr (P-well) | L.V.PTr (N-well) | H.V.PTr (N-well) | H.V.NTr (A part of data storage circuit and peripheral circuit) |
|---|---|---|---|---|---|---|---|
| | (P-well) | (N-well) | | | | | |
| Erase | Vera (20V) | Vera (20V) | Vss (0V) or negative potential (−2V) | Vss (0V) | Vdd (2.5V) | Vdd (2.5V) | Vss (0V/0V or Vdd) |
| Program | Vss (0V) | Vss (0V) | Negative potential (−2V) | Vss (0V) | Vdd (2.5V) | Vdd (2.5V)/Vpgmh | Vss (0V/0V or Vdd) |
| Positive read | Vss (0V) | Vss (0V) | Negative potential (−2V) | Vss (0V) | Vdd (2.5V) | Vdd (2.5V)/Vreadh | Vss (0V/0V or Vdd) |

FIG. 6

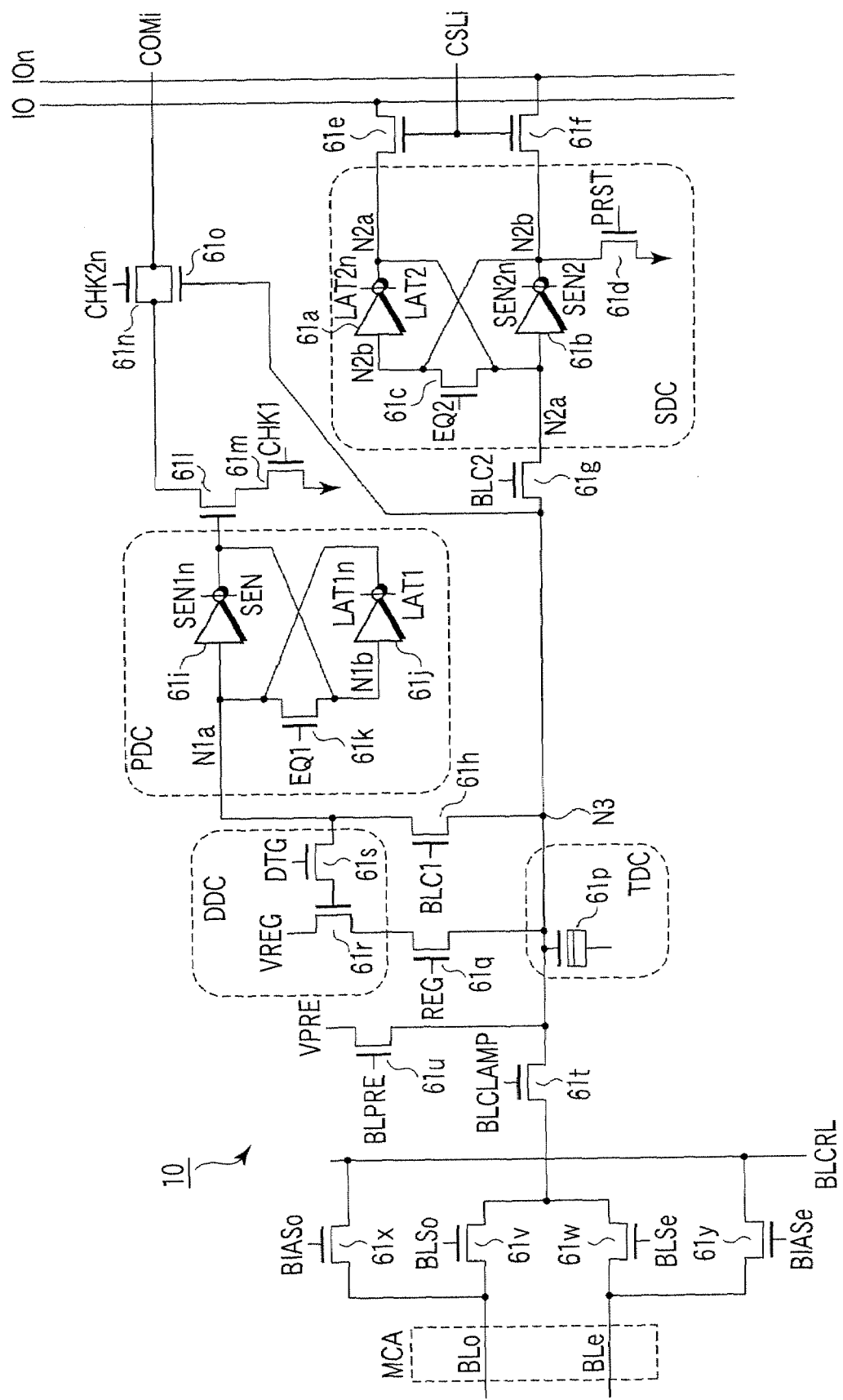
F I G. 7

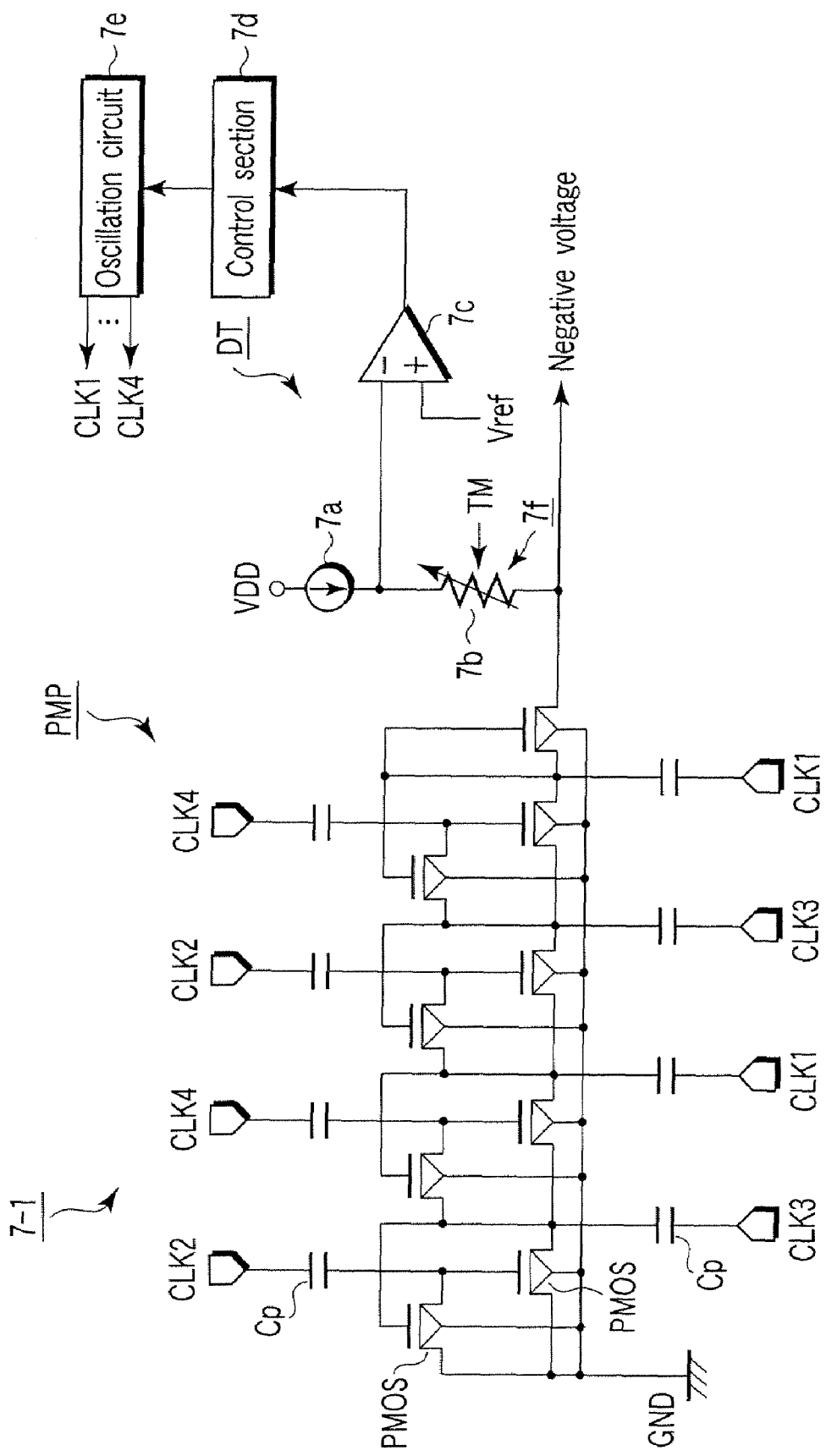
F I G. 8

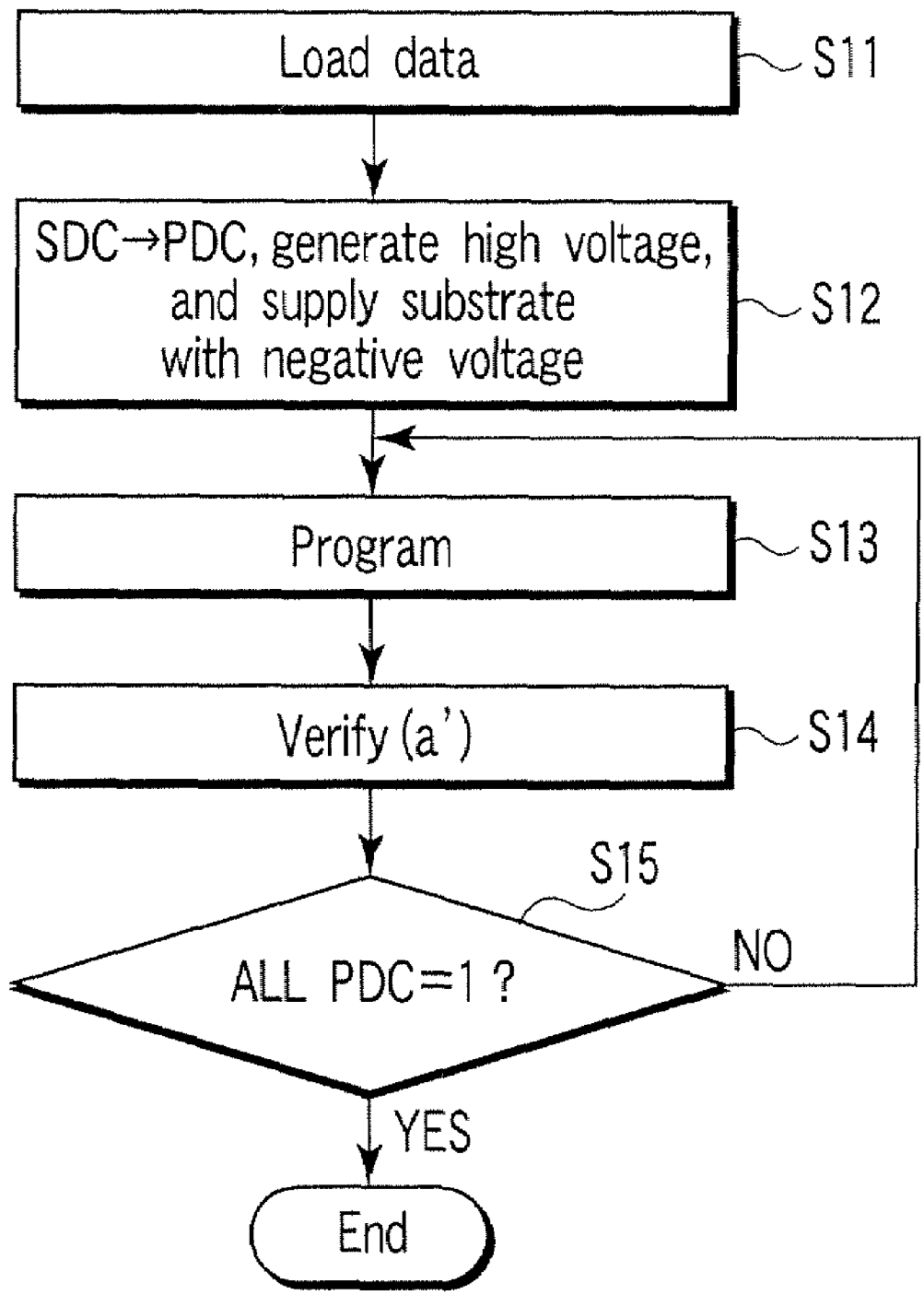
F I G. 12

HIGH-SPEED WRITABLE SEMICONDUCTOR MEMORY DEVICE

CROSS-REFERENCE TO RELATED APPLICATIONS

This application is based upon and claims the benefit of priority from prior Japanese Patent Application No. 2005-371125, filed Dec. 23, 2005, the entire contents of which are incorporated herein by reference.

BACKGROUND OF THE INVENTION

1. Field of the Invention

The present invention relates to a NAND type flash memory using, for example, EEPROM, and in particular, to a semiconductor memory device that enables multivalue data to be stored in a single cell.

2. Description of the Related Art

A NAND type flash memory has a plurality of memory cells arranged in a column direction and connected together in series to constitute NAND cells each of which is connected to a corresponding bit line via a select gate. Each bit line is connected to a latch circuit that latches write data and read data. All or half of the plurality of cells arranged in a row direction are simultaneously selected. A write operation or a read operation is executed on the simultaneously selected all or half of the cells at a time. A plurality of NAND cells arranged in the row direction constitute a block. An erase operation is executed on each block. The erase operation sets the threshold voltage of memory cells negative. The write operation injects electrons into memory cells to set the threshold voltage positive (see, for example, Jpn. Pat. Appln. KOKAI Publication No. 2004-192789).

In a NAND cell, the plurality of memory cells are connected together in series. Thus, during a read operation, unselected cells need to be on, so that a voltage (Vread) higher than the threshold voltage is applied to gate electrodes of the unselected cells. Thus, during the write operation, the threshold voltage set for the cells must not exceed Vread. Accordingly, during a write sequence, a program operation and a program verify read operation are repeatedly executed on each bit to control a threshold distribution so that the threshold voltage does not exceed Vread.

With the recently increased capacities of memories, multivalue memories have been developed which store at least 2 bits in a single cell. For example, storing 2 bits in a single cell requires four threshold distributions to be set so that the threshold voltages do not exceed Vread. The threshold distributions thus need to be controlled so that they are narrower than in the case where 1 bit and two threshold distributions are stored in a single cell. Further, storing 3 or 4 bits in a single cell requires 8 or 16 threshold distributions to be set. This in turn requires the distribution width of a single threshold voltage to be drastically reduced. Such a small threshold voltage distribution width requires the precise repetition of a program operation and a verify operation, disadvantageously reducing a write speed. Therefore, a semiconductor memory device has been desired which enables the write speed to be increased.

BRIEF SUMMARY OF THE INVENTION

According to a first aspect of the invention, there is provided a semiconductor memory device comprising a memory cell array having word lines and bit lines and in which a plurality of series connected memory cells are arranged in a matrix, one of a plurality of threshold voltages being set for each of the memory cells; a select transistor which selects from the word lines; and a control circuit which controls potentials of the word lines and bit lines in accordance with input data, the control circuit controlling a data write operation, a data read operation, and a data erase operation executed on the memory cells, wherein the select transistor is formed on a substrate, and for a read operation, the substrate is supplied with a first negative voltage, a selected word line is supplied with a first voltage (first voltage$\geq$first negative voltage), and unselected word lines are supplied with a second voltage.

According to a second aspect of the invention, there is provided a semiconductor memory device comprising a memory cell array having word lines and bit lines and in which a plurality of series connected memory cells are arranged in a matrix, one of a plurality of threshold voltages being set for each of the memory cells; a select transistor which selects from the word lines; and a control circuit which controls potentials of the word lines and bit lines in accordance with input data to control a data write operation, a data read operation, and a data erase operation executed on the memory cells, wherein the select transistor is formed on a substrate, and for a write operation, the substrate is supplied with a second negative voltage, and some of unselected word lines are supplied with a third voltage (third voltage$\geq$second negative voltage).

According to a third aspect of the invention, there is provided a semiconductor memory device comprising a memory cell array in which a plurality of series connected memory cells connected to word lines and bit lines and for each of which one of a plurality of threshold voltages is set are arranged in a matrix; a select transistor which selects from the word lines; and a control circuit which controls potentials of the word lines and bit lines in accordance with input data to control a data write operation, a data read operation, and a data erase operation executed on the memory cells, wherein the select transistor is formed on a substrate, and for an erase verify read operation, the substrate is supplied with a third negative voltage, and a selected word line is supplied with a third voltage (fourth voltage$\geq$third negative voltage).

According to a fourth aspect of the invention, there is provided a semiconductor memory device comprising a memory cell array in which a plurality of series connected memory cells connected to word lines and bit lines are arranged in a matrix; a control section which supplies a first voltage to a first bit line of the bit lines corresponding to a first memory cell to which a first threshold voltage is written, the control section supplying a second bit line corresponding to a second memory cell to which a second threshold voltage lower than the first threshold voltage is written, with a voltage obtained by adding the first voltage to a difference voltage between the first threshold voltage and the second threshold voltage, the control section supplying a third bit line connected as the source line and corresponding to the first memory cell, with a second voltage lower than the first voltage, the control section supplying a fourth bit line connected as the source line and corresponding to the second memory cell, with a voltage obtained by adding the second voltage to the difference voltage between the first threshold voltage and the second threshold voltage; a first data storage circuit which detects and holds the potential of the first bit line during a write data verify operation; and a second data storage circuit which detects and holds the potential of the second bit line during the write data verify operation.

BRIEF DESCRIPTION OF THE SEVERAL VIEWS OF THE DRAWING

FIGS. 2A and 2B are diagrams showing the threshold voltage relationship between the prior art and a first embodiment;

FIGS. 5A and 5B are sectional views showing a memory cell and a select transistor;

FIG. 6 is a diagram showing potentials supplied to wells during an erase operation, a program operation, and a read operation according to the first embodiment;

FIG. 7 is a circuit diagram showing an example of a data storage circuit shown in FIG. 3;

FIG. 8 is a circuit diagram showing an example of a negative voltage generating circuit shown in FIG. 2;

FIG. 12 is a flowchart showing a first page write operation;

DETAILED DESCRIPTION OF THE INVENTION

Figure 2A:
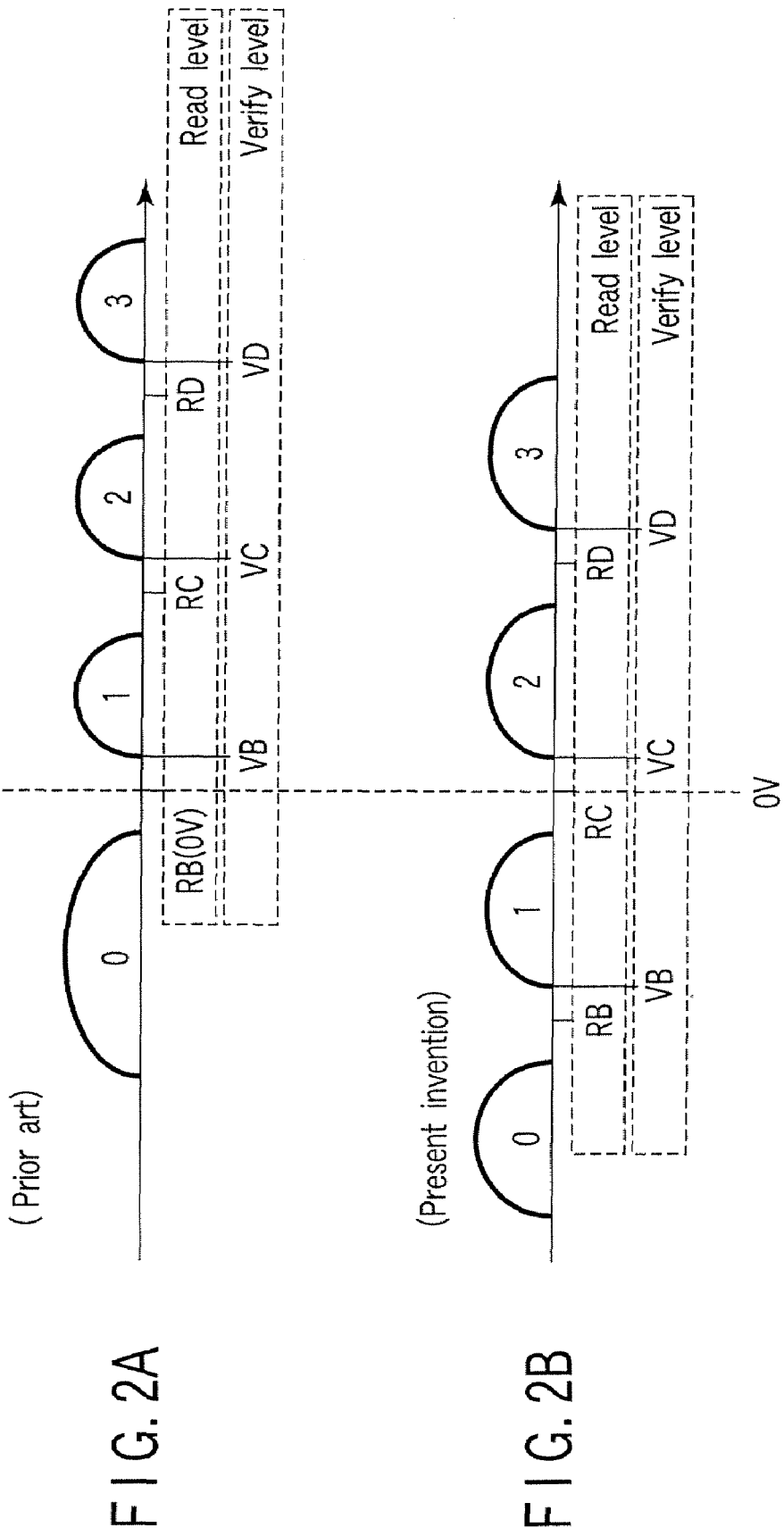

FIGS. 2A and 2B show the threshold voltage relationship between the prior art and the present embodiment. FIGS. 2A and 2B show that 2-bit 4-value data is stored.

The present embodiment sets, for example, a plurality of threshold voltages for a negative side for voltages lower than 0 V. Thus setting the plurality of threshold voltages for the negative side enables the distribution width of each threshold to be increased without changing Vread. This allows the number of program and verify operations to be reduced, enabling an increase in write speed.

Setting such threshold voltages requires the following configuration. For a read operation and a verify read operation, that is, to set a gate electrode of a selected cell to a negative voltage, the corresponding word line needs to be set to a negative potential. Thus, for example, an N channel MOS transistor constituting a row decoder and having a high breakdown voltage is formed on a P-type substrate, which is then supplied with a negative voltage. At this time, unselected word lines in a selected block are supplied with Vread (for example, 5 V) to conduct unselected cells. The P-type substrate is set to a negative voltage by a charge pump. However, also setting a P-type well region of an N channel MOS transistor for a peripheral circuit to a negative voltage increases a load on the charge pump; the N channel MOS transistor is formed in a P-type well region on the P-type substrate. The N channel MOS transistor for a peripheral circuit is thus formed in a P-type well region on an N-type well region to reduce the capacitance of the P-type substrate.

Further, to prevent an erroneous "1" write operation (non-write), write schemes called RLSB (Revised Local Self Boost) and REASB (Revised Erased Local Self Boost) have been proposed. With these write schemes, channel regions of those of the NAND cells that are close to a write cell are set off to allow the potentials of the channel regions to be easily boosted. The corresponding word lines are thus supplied with a ground potential. However, in the present embodiment, if the cells are erase cells, their threshold voltages are deeper on the negative side than in the prior art as shown by data "0" in FIG. 2B. Thus, to turn off the channel regions of those of the NAND cells that are close to the write cell, the corresponding word lines need to be supplied with a negative voltage.

The present embodiment will be described below with reference to the drawings.

Figure 3:
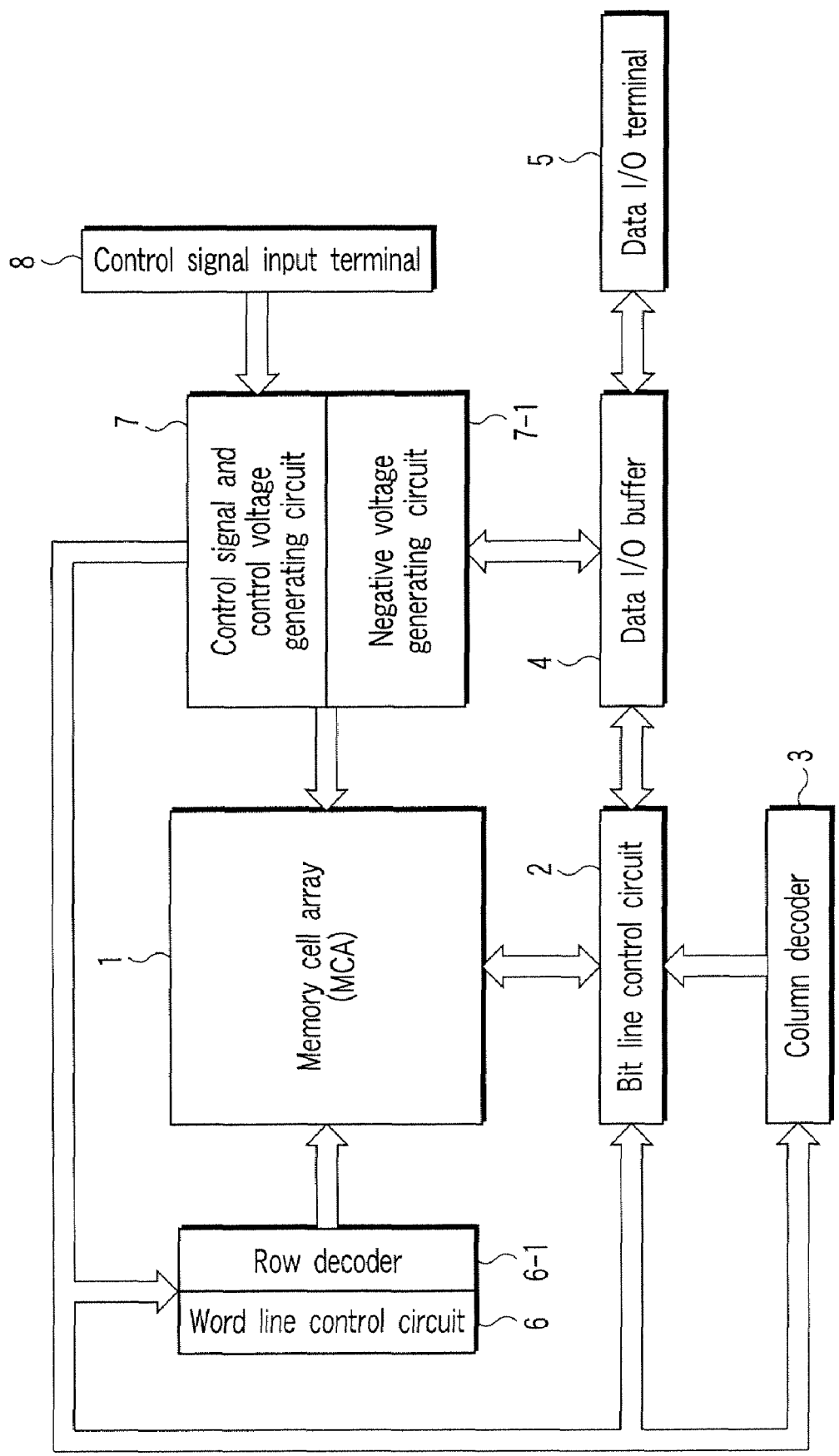
FIG. 3 is a block diagram showing an example of a semiconductor memory device according to the first embodiment.

FIG. 3 shows the configuration of a semiconductor memory device according to the present embodiment, specifically, a NAND type flash memory that stores 4-value (2-bit) data.

A memory cell array 1 includes a plurality of bit lines, a plurality of bit lines, and a common source line, and has electrically data rewritable memory cells comprising, for example, EEPROM cells and arranged in a matrix. A bit line control circuit 2 that controls bit lines and a word line control circuit 6 are connected to the memory cell array 1.

The bit line control circuit 2 reads data from a memory cell in the memory cell array 1 via a bit line and detects the status of the memory cell in the memory cell array via the bit line. The bit line control circuit 2 further applies a write control voltage to the memory cell in the memory cell array 1 via the bit line to write data to the memory cell. A column decoder 3 and a data I/O buffer 4 are connected to the bit line control circuit 2. A data storage circuit in the bit line control circuit 2, which will be described below, is selected by the column decoder 3. Data from the memory cell read into the data storage circuit is output from a data I/O terminal 5 to an external device via the data I/O buffer 4.

Write data externally input to the data I/O terminal 5 is input via the data I/O buffer 4 to a data storage circuit selected by the column decoder 3.

The word line control circuit 6 includes a row decoder 6-1. The word line control circuit 6 selects a word line in the memory cell array 1 via a row decoder 6-1 and applies a voltage required for a read, write, or erase operation to the selected word line.

The memory cell array 1, bit line control circuit 2, column decoder 3, data I/O buffer 4, and word line control circuit 6 are connected to and controlled by a control signal and control voltage generating circuit 7. The control signal and control voltage generating circuit 7 is connected to a control signal input terminal 8 and controlled by a control signal externally input via the control signal input terminal 8. The control signal and control voltage generating circuit 7 includes a negative voltage generating circuit 7-1 described below. The negative voltage generating circuit 7-1 generates a negative voltage for a write operation and a read operation.

The bit line control circuit 2, column decoder 3, word line control circuit 6, and control signal and control voltage generating circuit 7 constitute a write circuit and a read circuit.

Figure 4:
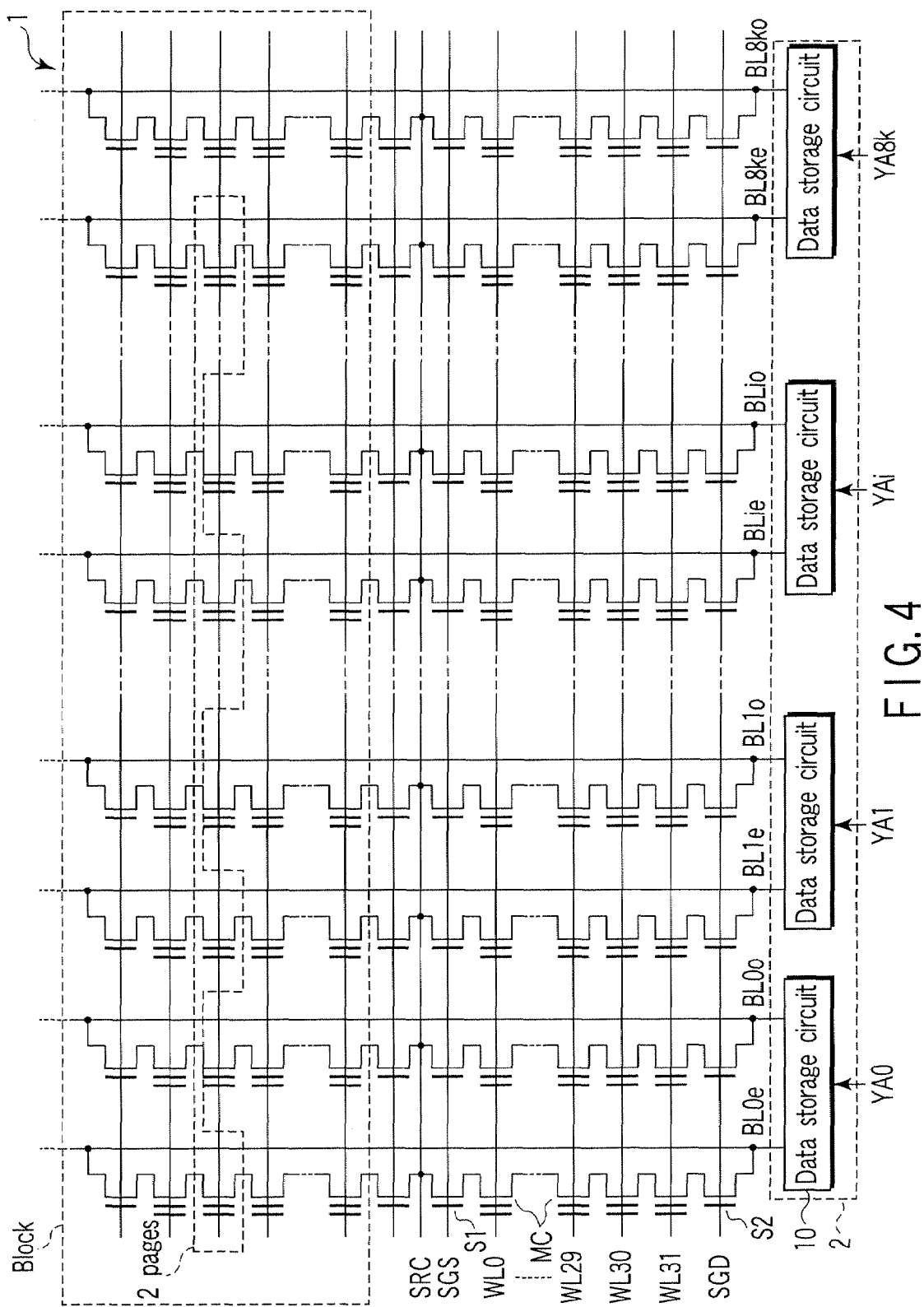
FIG. 4 is a circuit diagram showing the configuration of a memory cell array and a bit line control circuit which are shown in FIG. 3.

FIG. 4 shows the configuration of the memory cell array 1 and bit line control circuit 2, shown in FIG. 3. A plurality of NAND cells are arranged in the memory cell array 1. Each NAND cell is composed of a memory cell MC comprising, for example, 32 EEPROMs connected together in series and select gates S1 and S2. The select gate S2 is connected to a bit line BL0e. The select gate S1 is connected to a source line SRC. All the control gates of memory cells MC arranged in each row are connected to a word line WL0 to WL29, WL30, or WL31. All the select gates S2 are connected to a select line SGD. All the select gates S1 are connected to a select line SGS.

The bit line control circuit 2 has a plurality of data storage circuits 10. A pair of bit lines, (BL0e and BL0o), (BL1e and BL1o) . . . (BLie and BLio), or (BL8ke and BL8ko) is connected to each data storage circuit 10.

The memory cell array 1 includes a plurality of blocks as shown by a broken line. Each block is composed of a plurality of NAND cells. Data is erased, for example, in blocks. An erase operation is simultaneously executed on two bit lines connected to the data storage circuit 10.

A plurality of memory cells (enclosed by a broken line) connected to one word line and each arranged for every other bit line constitute one sector. Data is written to and read from each sector.

For a read operation, a program verify operation, and a program operation, one of the two bit lines (BLie and BLio) connected to the data storage circuit is selected in accordance with an externally supplied address signal (YA0, YA1 . . . YA1 . . . YA8k). Further, one word line is selected in accordance with an external address.

FIGS. 5A and 5B show sectional views of a memory cell and a select transistor. FIG. 5A shows a memory cell. N type diffusion layers 42 as a source and a drain of a memory cell are formed on a substrate 51 (P-type well region (hereinafter referred to as a P well region) 55) described below. A floating gate (FG) 44 is formed on a P well region 55 via a gate insulating film 43. A control gate (CG) 46 is formed on the floating gate 44 via an insulating film 45. FIG. 5B shows a select gate. N type diffusion layers 47 as a source and a drain are formed on the P well region 55. A control gate 49 is formed on the P well region 55 via a gate insulating film 48.

Figure 1:
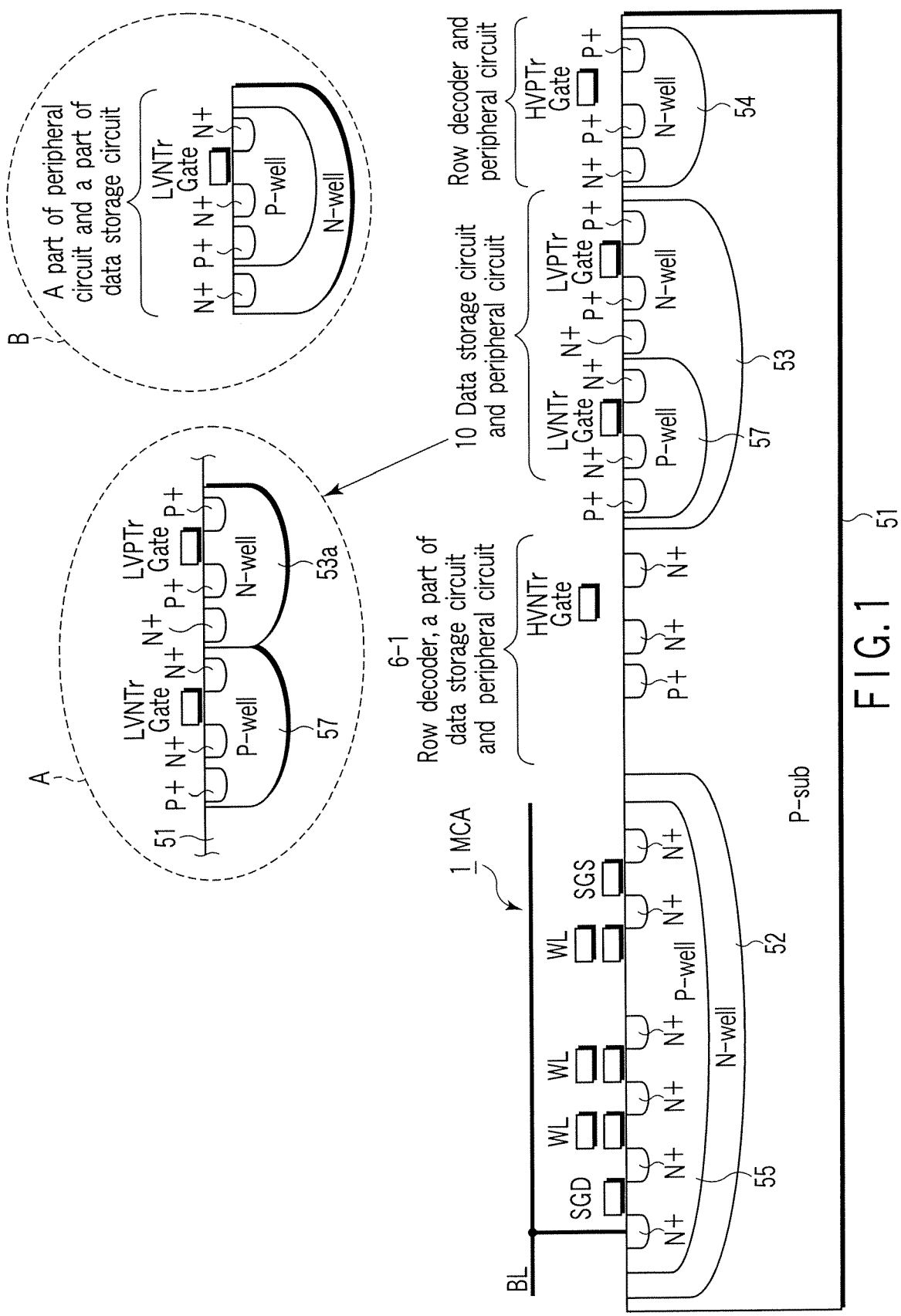
FIG. 1 is a sectional view showing a semiconductor memory device according to a first embodiment.

FIG. 1 is a sectional view of a semiconductor memory device according to the present embodiment. In FIG. 1, for example, N-type well regions (hereinafter referred to as N well regions) 52, 53, and 54 and a P well region 57 are formed in the P-type substrate 51. A P well region 55 is formed in the N well region 52. A low-voltage N channel MOS transistor LVNTr constituting the memory cell array 1 is formed in the P well region 55. A low-voltage N channel MOS transistor LVNTr constituting a data storage circuit 10 is formed in the P well region 57. A low-voltage P channel MOS transistor LVPTr constituting a data storage circuit 10 as well as the P well region 57 are formed in the N well region 53. The data storage circuit 10 and a low-voltage N channel MOS transistor LVNTr constituting a peripheral circuit transistor are formed in the P well region 57.

A row decoder 6-1 and a peripheral high-breakdown-voltage N channel MOS transistor HVNTr are formed on the P-type substrate 51. A high-voltage P channel MOS transistor HVPTr constituting, for example, a word line driving circuit is formed in the N well region 54. High-voltage transistors HVNTr and HVPTr have, for example, thicker gate insulating films than the low-voltage transistors LVNTr and LVPTr.

FIG. 6 shows potentials supplied to the wells for an erase operation, a program operation, and a read operation. For a program operation and a data read operation, a negative potential, for example, −2 V is supplied to the P-type substrate on which an N channel MOS transistor constituting the row decoder 6-1 is formed.

FIG. 7 is a circuit diagram showing an example of the data storage circuit 10, shown in FIG. 5.

The data storage circuit 10 has a primary data cache (PDC), a secondary data cache (SDC), a dynamic data cache (DDC), and a temporary data cache (TDC). SDC, PDC, and DDC hold input data for a write operation, hold read data for a read operation, and temporarily hold data for a verify operation. SDC, PDC, and DDC are also used to manipulate internal data to store multivalue data. TDC amplifies and temporarily holds data on bit lines for a data read operation and is used to manipulate internal data to store multivalue data.

SDC is composed of clocked inverter circuits 61a and 61b and transistors 61c and 61d which constitute a latch circuit. The transistor 61c is connected to between an input end of the clocked inverter circuit 61a and an input end of the clocked inverter circuit 61b. A gate of the transistor 61c is supplied with a signal EQ2. The transistor 61d is connected to between an output end of the clocked inverter circuit 61b and the ground. A gate of the transistor 61d is supplied with a signal PRST. A node N2a of SDC is connected to an I/O data line IO via a column select transistor 61e. A node N2b of SDC is connected to an I/O data line IOn via a column select transistor 61f. Gates of the transistors 61e and 61f are supplied with a column select signal CSLi. The node N2a of SDC is connected to a node N1a of PDC via transistors 61g and 61h. A gate of the transistor 61g is supplied with a signal BLC2. A gate of the transistor 61h is supplied with a signal BLC1.

PDC is composed of clocked inverter circuits 61i and 61j and a transistor 61k. The transistor 61k is connected to between an input end of the clocked inverter circuit 61i and an input end of the clocked inverter circuit 61j. A gate of the transistor 61k is supplied with a signal EQ1. A node N1b of PDC is connected to a gate of the transistor 61l. One end of a current path through the transistor 61l is grounded via a transistor 61m. A gate of the transistor 61m is supplied with a signal CHK1. The other end of the current path through the transistor 61l is connected to one end of a current path through transistors 61n and 61o constituting a transfer gate. A gate of the transistor 61n is supplied with a signal CHK2n. A gate of the transistor 61o is connected to a connection node N3 of the transistors 61g and 61h. A signal line COMi is connected to the other end of the current path through the transistors 61n and 61o. The signal line COMi is common to all the data storage circuits 10. The level of the signal line COMi indicates whether or not all the data storage circuits 10 have been verified. That is, as described below, the completion of verification sets the node N1b of PDC to a low level. In this state, setting the signals CHK1 and CHK2n to a high level sets the signal line COMi to the high level if all the data storage circuits 10 have been verified.

TDC is composed of, for example, a MOS capacitor 61*p*. The capacitor 61*p* is connected to between the connection node N3 for the transistors 61*g* and 61*h* and the ground. DDC is connected to the connection node N3 via a transistor 61*q*. A gate of the transistor 61*q* is supplied with a signal REG.

DDC is composed of transistors 61*r* and 61*s*. One end of a current path through the transistor 61*r* is supplied with a signal VREG, and the other end is connected to a current path through the transistor 61*q*. A gate of the transistor 61*r* is connected to the node N1*a* of PDC via the transistor 61*s*. A gate of the transistor 61*s* is supplied with a signal DTG.

One end of a current path through transistors 61*t* and 61*u* is connected to the connection node N3. The other end of the current path through the transistor 61*u* is supplied with a signal VPRE, with its gate supplied with a signal BLPRE. A gate of transistor 61*t* is supplied with a signal BLCLAMP. The other end of the current path through the transistor 61*t* is connected to one end of the bit line BLo via a transistor 61*v* and to one end of the bit line BLe via a transistor 61*w*. The one end of the bit line BLo is connected to one end of a current path through a transistor 61*x*. A gate of the transistor 61*x* is supplied with a signal BIASo. The one end of the bit line BLe is connected to one end of a current path through a transistor 61*y*. A gate of the transistor 61*y* is supplied with a signal BIASe. The other end of the current path through the transistors 61*x* and 61*y* is supplied with a signal BLCRL. The transistors 61*x* and 61*y* are turned on complementarily to the transistors 61*v* and 61*w* in accordance with the signals BIASo and BIASe to supply the potential of the signal BLCRL to unselected bit lines.

The signals and voltages are generated by a control signal and control voltage generating circuit 7 shown in FIG. 3. Operations described below are controlled on the basis of the control signal and control voltage generating circuit 7.

FIG. 8 shows an example of a negative voltage generating circuit 7-1. The negative voltage generating circuit 7-1 is composed of, for example, a 4-phase pump circuit PMP, a detection circuit DT, a control section 7*d*, and an oscillation circuit 7*e*. The pump circuit PMP is composed of, for example, a plurality of P channel MOS transistors PMOS and a plurality of capacitors Cp. One end of each capacitor Cp is supplied with a clock signal CLK1 to CLK4. The clock signals CLK1 to CLK4 sequentially turns on PMOS to generate a negative voltage.

The detection circuit DT is connected to an output end of the pump circuit PMP. The detection circuit DT is composed of a constant current source 7*a*, a resistor 7*b*, and a differential amplifier 7*c*. The constant current source 7*a* and the resistor 7*b* are connected in series between a node to which power Vdd is supplied and the output end of the pump circuit PMP. One input end of the differential amplifier 7*c* is connected to a connection node for the constant current source 7*a* and resistor 7*b*. The other end of the differential amplifier 7*c* is supplied with a reference voltage Vref. The reference voltage Vref is generated by, for example, a band gap reference circuit and is about 1 V. The detection circuit DT detects an output voltage from the pump circuit PMP on the basis of the reference voltage Vref. The detection output signal is supplied to the control section 7*d*. The control section 7*d* controls the oscillation circuit 7*e* in accordance with the detection output signal. The oscillation circuit 7*e* is oscillated or stopped on the basis of control by the control section 7*d*. The pump circuit PMP thus generates a constant negative voltage.

The resistor 7*b* constitutes a trimming circuit 7*f*. The trimming circuit 7*f* varies the resistance value of the resistor 7*b* in accordance with a trimming signal TM to switch the level of a negative voltage output from the pump circuit PMP. The trimming signal TM is generated, for example, by the control signal and control voltage generating circuit 7 for a data read operation or a program verify operation. Accordingly, the negative voltage generating circuit 7-1 generates various levels of negative voltages for a data read operation or a program verify operation.

The present memory is a multivalue memory, which can store 2-bit data in a single cell. The 2 bits are switched in accordance with an address (first page or second page).

Figure 9A:
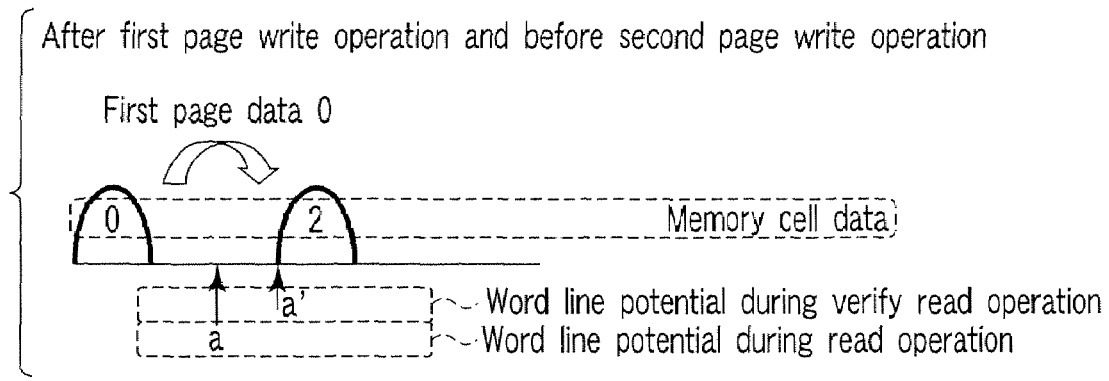
FIGS. 9A, 9B, and 9C are diagrams showing the relationship between memory cell data and memory cell thresholds.
Figure 9B:
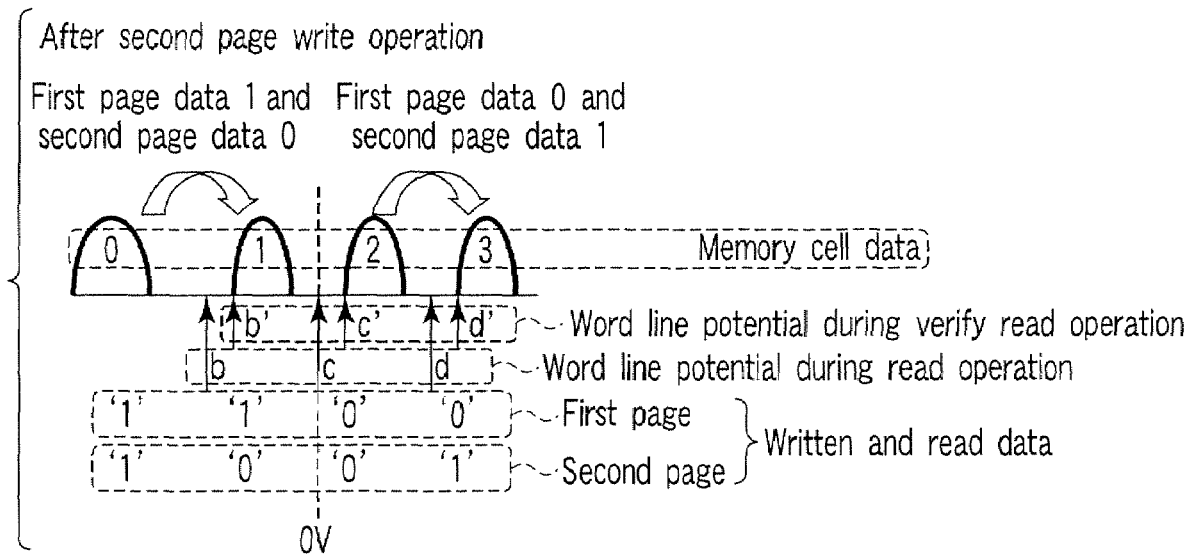
Figure 9C:
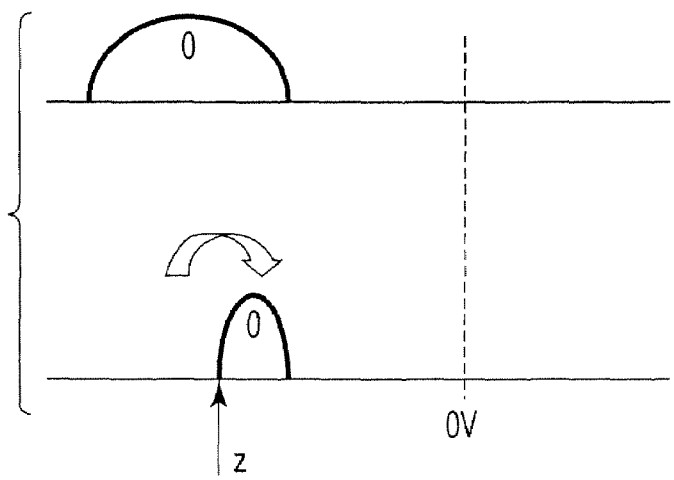

FIGS. 9A, 9B, and 9C show the threshold relationship between memory cell data and memory cell thresholds. As shown in FIG. 9C, an erase operation sets memory cell data to "0". The data "0" is a negative voltage lower than 0 V. As described below, to apply the RLSB and REASB write schemes, a verify voltage "z" is used to execute verification. If the threshold voltage is equal to or lower than the verify voltage "z", a write operation is continued until the threshold voltage becomes equal the verify voltage "z".

As shown in FIG. 9A, a first page write operation places the data "0" and "2" in the memory cell. Further, as shown in FIG. 9B, a second page write operation places the data "0", "1", "2", and "3" in the memory cell. In the present embodiment, the memory cell data is defined in order of increasing threshold voltage.

Figure 10:
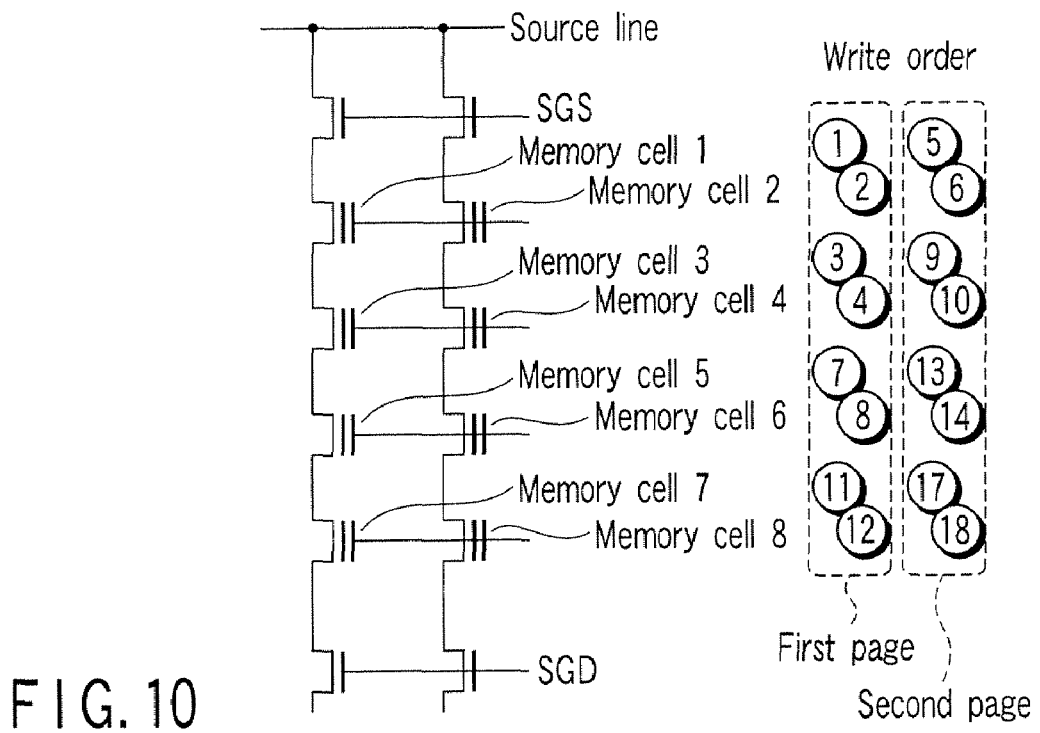
FIG. 10 is a diagram showing a write order according to the first embodiment.

FIG. 10 generally shows the write order according to the present embodiment. As shown in FIG. 10, within a block, a write operation is executed on each page starting with the memory cell closest to the source line. In this case, to eliminate the adverse effects of the threshold voltage of the adjacent memory cell on which a write operation has been finished, the order of write operations on the memory cells is specified as shown in FIG. 10.

Figure 11:
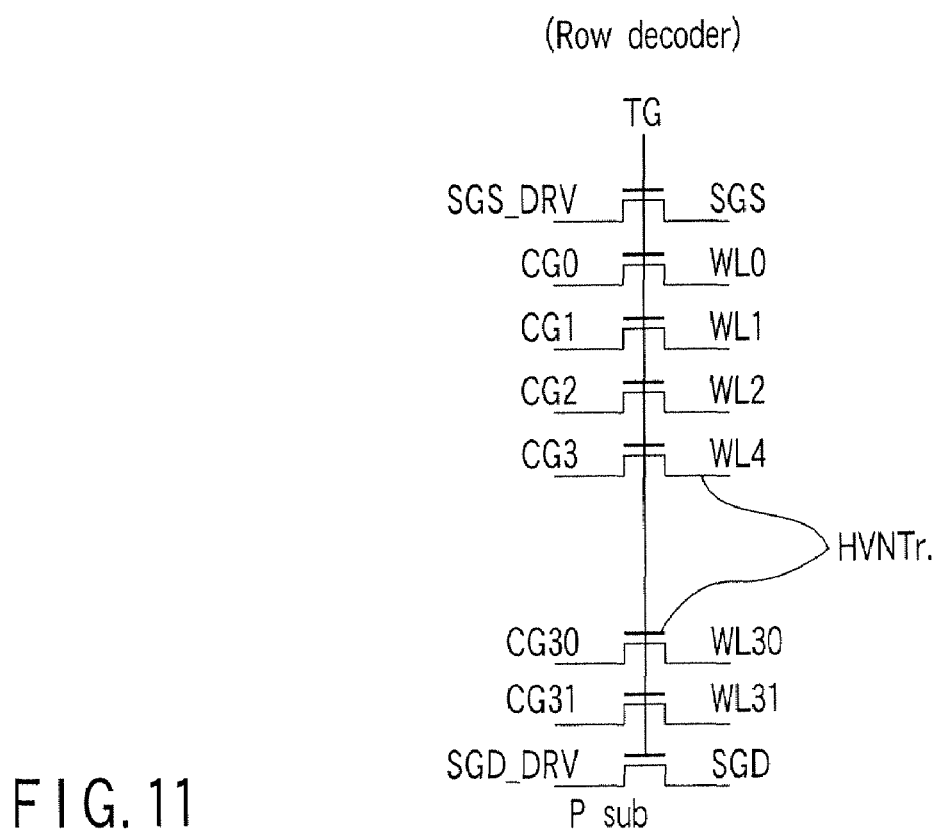
FIG. 11 is a diagram showing a transfer gate constituting a part of a row decoder shown in FIG. 2.

FIG. 11 shows a transfer gate constituting a part of the row decoder 6-1. The transfer gate is composed as a plurality of the N channel MOS transistors HVNTr described above. One end of each transistor HVNTr is supplied with a voltage SGS_DRV, CG0 to CG31, or SGD_DRV. The other ends of the transistors HVNTr are connected to a select line SGS, word lines WL0 to WL31, and a select SGD, respectively. A gate of each transistor HVNTr is supplied with a signal TG. The transistors HVNTr in each select block are turned on in response to the signal TG to supply word lines WL0 to WL31 for the cells with a predetermined voltage.

The row decoder 6-1 is located on the P-type substrate 51.

(Read Operation)

As shown in FIG. 9A, a first page write operation places the data "0" or "2" in the memory cell. These data can thus be read by supplying the intermediate level "a" between these data the word line to execute a read operation. Further, as shown in FIG. 9B, a second page write operation places the data "0", "1", "2", or "3" in the memory cell. These data can thus be read by supplying the intermediate level "b", "c", or "d" between these data the respective word lines to execute a read operation. In the present embodiment, for example, the levels "a" and "b" are negative voltages.

Here, the well (P well region 55 shown in FIG. 1) of each memory cell, each source line, and each unselected bit line are set to Vss (ground potential=0 V). The P-type substrate 51 is set to a negative potential (for example, −2 V). The transfer gate of each unselected block is turned off. This allows the word lines in the unselected block to float and sets each selected gate at Vss. The transfer gate of each selected block is turned on to set the selected word lines in the selected block at a read potential (for example, −2 V to 3 V), the unselected word lines in the selected block at Vread (for example, 5 V), and the selected gate SGD in the selected block at Vsg (Vdd+

Vth, for example, 2.5 V+Vth). In this case, when the read potential is not negative, the P-type substrate 51 may be set to Vss.

Then, in the data storage circuit 10, shown in FIG. 7, the signal VPRE is set to Vdd (for example, 2.5 V), the signal BLPRE is set to Vsg (Vdd+Vth), and the signal BLCLAMP is set to, for example, (0.6 V+Vth). Each bit line is precharged to, for example, 0.6 V. Then, the select line SGS, located on the cell source side, is set to Vdd. When the memory cell threshold voltage is higher than the read potential, the cell is turned off. Accordingly, the bit line remains at the high level. When the memory cell threshold voltage is lower than the read potential, the cell is turned on. Accordingly, the potential of the bit line is set to Vss.

Subsequently, the signal BLPRE in the data storage circuit 10, shown in FIG. 7, is set to Vsg (Vdd+Vdh) to precharge the node N3 of TDC to Vdd. The signal BLCLAMP is set to, for example, (0.45 V+Vth). The node N3 of TDC is at the low level if the potential of the bit line is lower than 0.45 V. The node N3 of TDC is at the high level if the potential of the bit line is higher than 0.45 V. The signal BLClAMP is set to Vss, and the signal BLC1 is set to Vsg (Vdd+Vth) to load the potential of TDC into PDC. Consequently, if the cell threshold voltage is lower than the potential of the word line, PDC is at the low level. If the cell threshold voltage is higher than the potential of the word line, PDC is at the high level. A read operation is executed as described above.

(Program)

(First Page Write Operation)

Figure 13:
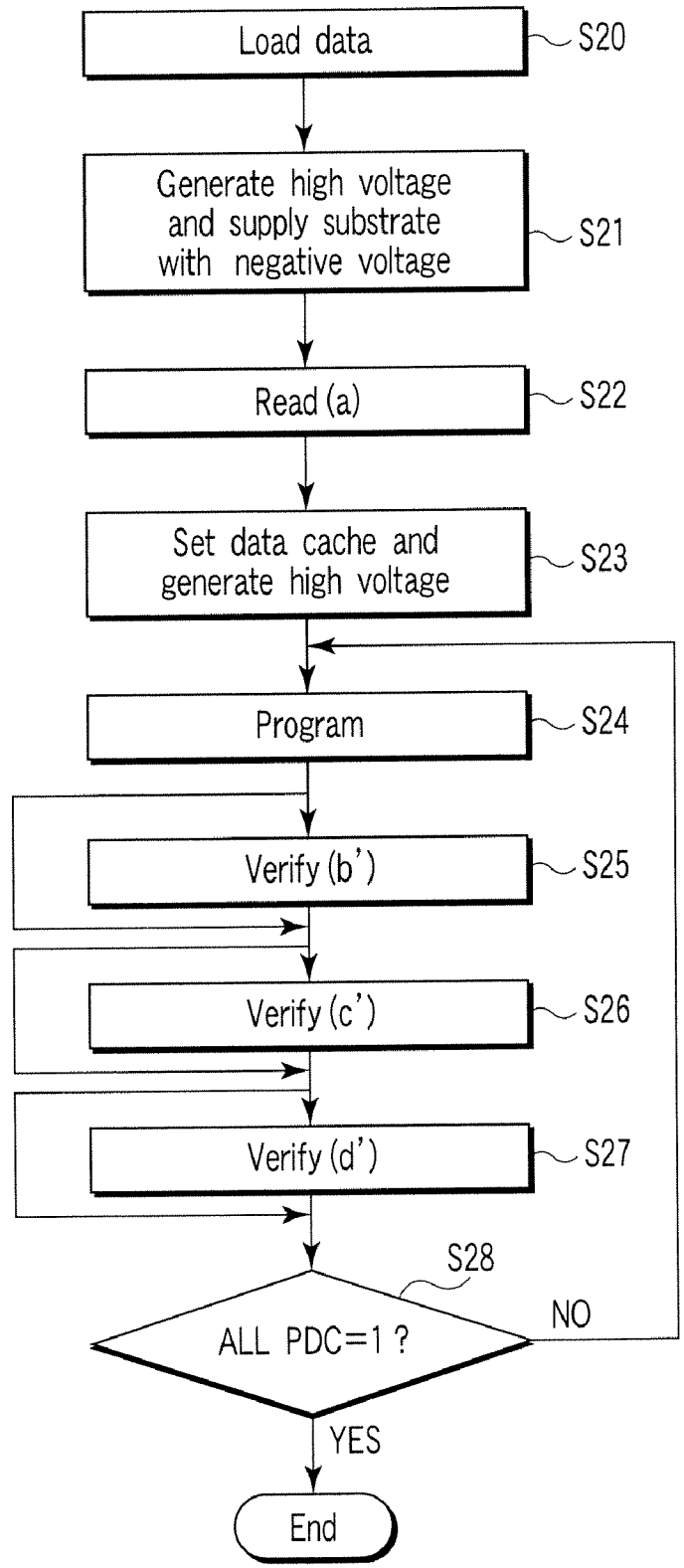
FIG. 13 is a flowchart showing a second page write operation.

FIG. 12 shows a first page write sequence, and FIG. 13 shows a second page write sequence.

A program operation first specifies an address to select half of the memory cells (2 pages) connected to one word line as shown in FIG. 4. The present memory can execute a program operation only in order of the first page and second page. Accordingly, the address is first used to select the first page.

In the first page write operation shown in FIG. 12, first, write data is externally input and stored in SDCs in all the data storage circuits (S11). A subsequently input write command transfers the data in SDCs in all the data storage circuits 10 to PDCs (S12). Externally input data "1" (write operation is not to be executed) sets the node N1*a* of PDC to the high level. Externally input data "0" (write operation is to be executed) sets the node N1*a* of PDC to the low level. Subsequently, the data in PDC is equal to the potential of the node N1*a*. The data in SDC is equal to the potential of the node N2*a*.

During the transfer of the data, a pump circuit (not shown) provided in the control signal and control voltage generating circuit 7 is started; the pump circuit generates a high voltage such as a program voltage Vpgm. Further, the negative voltage generating circuit 7-1 is started to supply a negative voltage to the P-type substrate 51. If the P well region 57 is formed directly in the substrate 51 as shown by the broken line A in FIG. 1, the P well region 57, in which the NMOS transistor LVNTr is formed, is also set to the negative voltage (−2 V). The capacitance between the gates of the NMOS transistors LVNTr is thus coupled to the substrate 51. This inter-gate capacitance is very large, requiring much time to charge the substrate 51 and increasing power consumption.

However, in the first embodiment, the N channel transistor LVNTr constituting the data storage circuit 10 is formed in the P well 57, which is formed in the N well region 53, as shown in FIG. 1. Thus, the N channel transistor LVNTr of the data storage circuit 10, which has a large capacitance, is separated from the substrate 51. This makes it possible to inhibit an increase in the capacitance of the P-type substrate 51. Consequently, the negative voltage generating circuit 7-1 can charge the substrate to a negative potential at a high speed. Further, while SDC is transferring data to PDC, the P-type substrate 51 is set and kept at a negative potential during programming. This enables a write operation to be achieved at a high speed.

If there is enough time to charge the substrate 51 to a negative potential, an N well region 53*a* may be formed in the substrate 51 together with the P well region 57 as shown by the broken line A in FIG. 1.

As shown in the broken line B in FIG. 1, HVNTr contained in a part or all the peripheral circuits may be formed in the P-type well formed in the N-type well. The voltages of "erase", "program", and "positive read" shown in FIG. 6 show voltages of HVNTr included in a part or all the peripheral circuits and voltages of P-type well and N-type well.

(Program Operation) (S13)

In the data storage circuit 10, shown in FIG. 7, setting the signal BLC1 at Vdd+Vth, the transistor 61*h* is set conductively. The data "1" (write operation is not to be executed) stored in PDC thus sets the bit line at Vdd. The data "0" (write operation is to be executed) stored in the sets the bit line at Vss. Further, a write operation must not executed on the cells in the unselected page (bit line is unselected) connected to the selected word line. Thus, the bit lines connected to these cells are set to Vdd, like the bit lines to which the data "1" is supplied.

The P-type substrate region is set to a negative potential (for example, −2 V) to turn off the transfer gate (shown in FIG. 11) in each unselected block. This cause the word lines in the unselected block to float, with the select gate set to Vss.

Energizing the transfer gate in each selected block supplies Vdd (or a potential slightly lower than Vdd) to the select line SGD in the selected block. Moreover, Vss is supplied to the select line SGS in the selected block, Vpgm (20 V) is supplied to a selected word line, and Vpass (10 V) is supplied to unselected word lines. Then, if the bit line is at Vss, a write operation is prevented because the channel of the cell is at Vss, while the word lines are at Vpgm. If the bit line is at Vdd, the channel of the cell is not at Vss. Consequently, coupling causes the channel to be booted. This reduces the potential difference between the gate and channel to prevent a write operation.

If a write operation is executed on the memory cells in the order shown in FIG. 10, the number of cells to which data has been written increases consistently with the distance from the source line. This may disadvantageously make it difficult to boot the channel, leading to an erroneous write operation. To solve this problem, the above RLSB and REASB write schemes have been developed. The RLSB write scheme sets a first word line adjacent to a selected one, a second word line adjacent to the first one, a third word line adjacent to the second one, or a line located several lines away from the selected one to Vss, while setting the selected word line to Vpgm and the other word lines to Vpass or an intermediate potential. The REASB write scheme sets a first word line adjacent to a source-side selected one, a second word line adjacent to the first one, a third word line adjacent to the second one, or a line located several lines away from the selected one to Vss, while setting the selected word line to Vpgm and the other word lines to Vpass or an intermediate potential. Thus, the first word line adjacent to the selected one, the second word line adjacent to the first one, the third word line adjacent to the second one, or the line located several lines away from the selected one is set to Vss to turn off the memory cell. This allows the channel immediately below the selected cell to be easily booted.

Figure 14A:
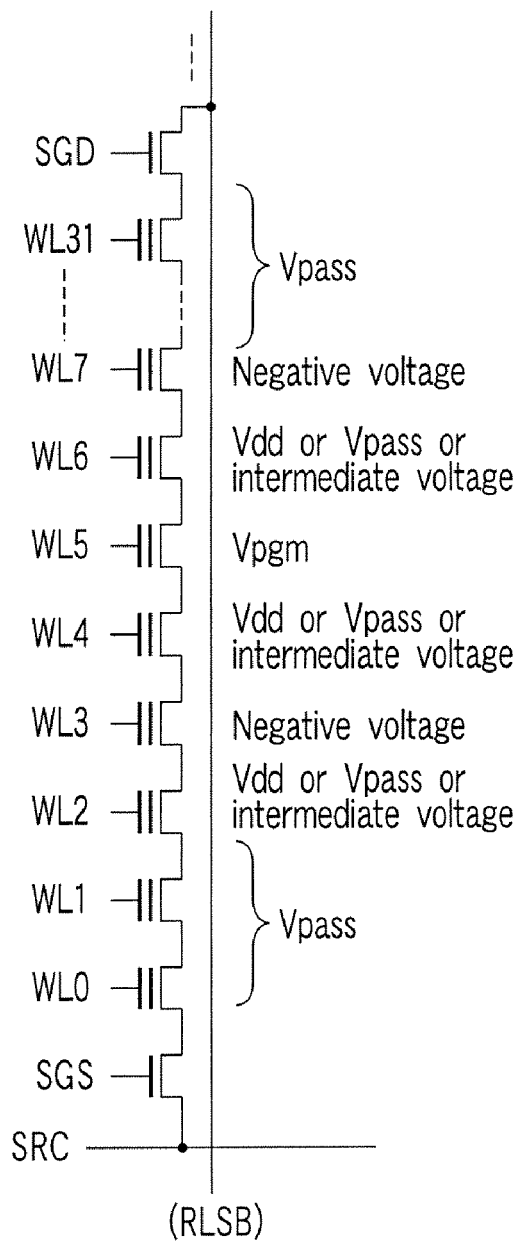
FIGS. 14A and 14B are a diagram showing the voltage of each section in accordance with an RLSB write scheme.
Figure 14B:
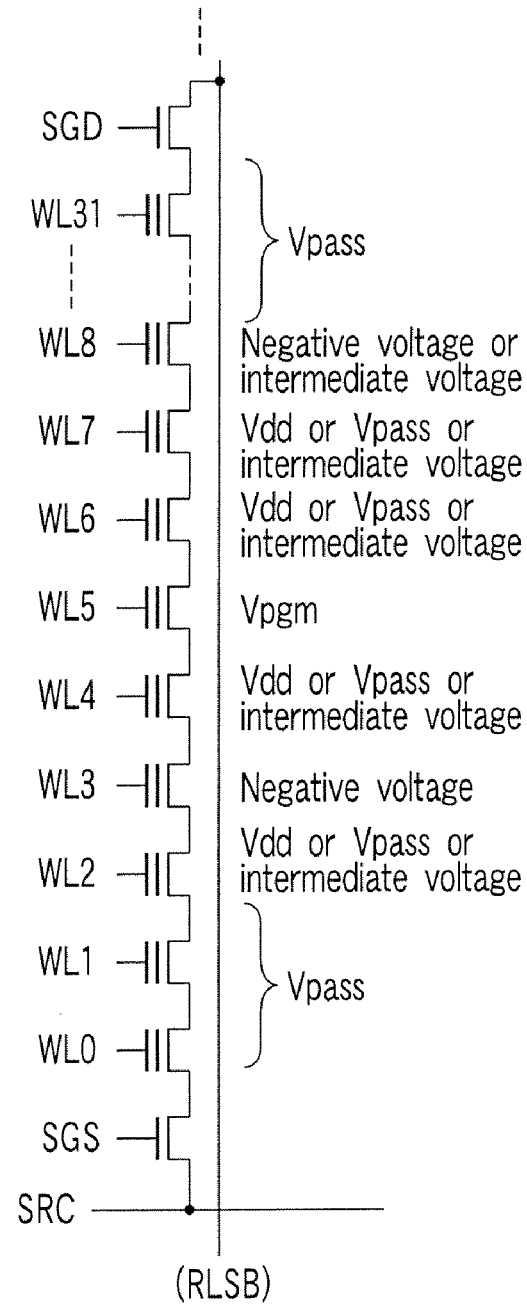
Figure 14C:
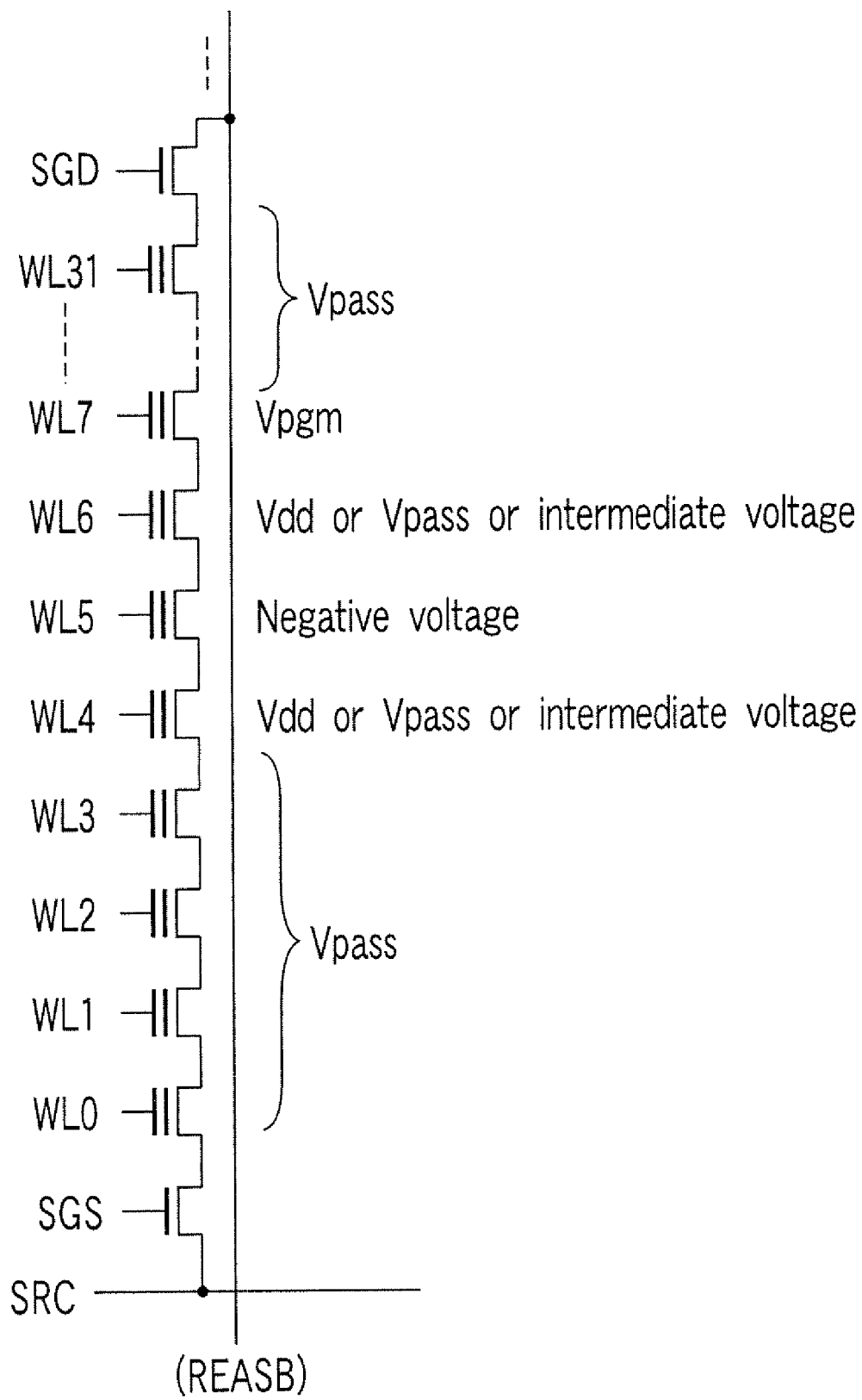
FIG. 14C is a diagram showing the voltage of each section in accordance with an REASB write scheme.

However, in the present embodiment, if a cell having a word line set to Vss is an erase cell, the threshold is a negative voltage, preventing the cell from being turned off. Thus, in the present embodiment, the RLSB write scheme, shown in FIGS. 14A and 14C, and the REASB write scheme, shown in FIG. 14C, set the first word line adjacent to the selected one or the second word line adjacent to the first one to a negative voltage, for example, (−1.5 V), instead of Vss. A first page write operation places the data "0" and "2" in the memory cell.

(Program Verify Read) (S14)

A program verify read operation is the same as the read operation except that the read operation is executed with a verify level "a'" slightly higher than the read level supplied to the word line. If the memory cell threshold voltage has reached the verify level "a'", the data in PDC is "1". This prevents a write operation.

If the memory cell threshold voltage has not reached the verify level "a'", the data in PDC is "0". If the data in PDC is not "1" in all the data storage circuits 10 (S15), a program operation is executed again (S13). A program operation and a verify operation are repeated until the data in PDC becomes "1" in all the data storage circuits 10.

(Second Page Write Operation)

A second page write operation shown in FIG. 13 first externally inputs and stores write data in SDC in all the data storage circuits (S20). The control signal and control voltage generating circuit 7 subsequently generates a write voltage, for example, Vsg. The negative voltage generating circuit 7-1 also generates and supplies a negative voltage to the substrate 51 (S21). Then, to check the data written during the first page write operation, a read level "a" (for example, a negative voltage) is set for the word line to read the data from the memory cell (S22). This read operation is as described above. If the cell threshold voltage is lower than the potential "a" of the word line, PDC is at the low level. If the cell threshold voltage is higher than the potential "a" of the word line, PDC is at the high level.

Subsequently, data cache is set (S23). That is, a second page write operation is executed as shown in FIG. 9B.

In the first page write operation, in case of the data "1" and in the second page write operation, in case of the data "1", the second page write operation is not executed.

In the first page write operation, in case of the data "1" and in the second page write operation, in case of the data "0", the second page write operation sets the data in the cell to "1".

In the first page write operation, in case of the data "0" and in the second page write operation, in case of the data "0", the second page write operation sets the data in the cell to "2".

In the first page write operation, in case of the data "0" and in the second page write operation, in case of the data "1", the second page write operation sets the data in the cell to "3".

To execute this operation, the data cache is set. At the same time, the control signal and control voltage generating circuit 7 generates a high write voltage, for example, Vpgm.

To set the memory cell data to "0" (data "1" in the first page and data "1" in the second page), PDC is set to the high level, DDC is set to the low level, and SDC is set to the high level.

To set the memory cell data to "1" (data "1" in the first page and data "0" in the second page), PDC is set to the low level, DDC is set to the high level, and SDC is set to the high level.

To set the memory cell data to "2" (data "0" in the first page and data "0" in the second page), PDC is set to the low level, DDC is set to the high level, and SDC is set to the low level.

To set the memory cell data to "3" (data "0" in the first page and data "1" in the second page), PDC is set to the low level, DDC is set to the low level, and SDC is set to the low level.

The data in PDC, DDC, and SDC is set by supplying the signals BLC1, BLC2, DTG, REG, and VREG in a predetermined order to transfer the data to or from PDC, DDC, SDC, and TDC. Specific operations will not be described.

(Program Operation) (S24)

The program operation is exactly the same as that for the first page. The data "1" stored in PDC prevents a write operation from being executed. The data "0" stored in PDC allows a write operation to be executed.

(Verify Operation) (S25, S26, and S27)

The program verify read operation is the same as the read operation. However, verify levels "b'", "c'", and "d'" are set slightly higher than the read level by adding a margin to the read level. A verify read operation is executed using the verify levels "b'", "c'", and "d'". For example, the verify level "b'" is a negative voltage, and the verify levels "c'" and "d'" are positive voltages.

The verify operation is executed, for example, in order of the verify levels "b'", "c'", and "d'".

That is, first, the verify level "b'" is set for the word line. Verification is then made of whether or not the memory cell threshold voltage has reached the verify level "b'" (S25). If the memory cell threshold voltage has reached the verify level, PDC is at the high level, preventing a write operation. If the memory cell threshold voltage has not reached the verify level, PDC is at the low level, allowing a write operation to be executed in the next program.

Subsequently, the verify level "c'" is set for the word line. Verification is then made of whether or not the memory cell threshold voltage has reached the verify level "c'" (S26). If the memory cell threshold voltage has reached the verify level, PDC is at the high level, preventing a write operation. If the memory cell threshold voltage has not reached the verify level, PDC is at the low level, allowing a write operation to be executed in the next program.

Then, the verify level "d'" is set for the word line. Verification is then made of whether or not the memory cell threshold voltage has reached the verify level "d'" (S27). If the memory cell threshold voltage has reached the verify level, PDC is at the high level, preventing a write operation. If the memory cell threshold voltage has not reached the verify level, PDC is at the low level, allowing a write operation to be executed in the next program.

A program operation and a verify operation are thus repeated until the data in PDC changes to the high level in all the data storage circuits 10.

A specific verify operation will be described below.

(Verify (b')) (S25)

The program verify operation provides the selected word line with the verify voltage "b'".

First, Vread (for example, 5 V) is supplied to unselected word lines in the selected block. Vsg (Vdd+Vth, for example, 2.5 V+Vth) is supplied to the select gate SGD in the selected block. The signal BLCLAMP in the data storage circuit 10 is set to (0.6 V+Vth) and the signal BLC2 is set to Vdd+Vth to precharge the bit line. When the data "2" and "3" is written to the memory cell, the data stored in SDC is "0". This prevents the bit line from being precharged. The bit line is precharged only when the data "0" and "1" is written to the memory cell.

Then, the source side select line SG2 of the cell is set to Vdd. When the threshold voltage is higher than the potential "b'", the cell is off and the bit line thus remains at the high level. Further, when the threshold voltage is lower than the potential "b'", the cell is on and the bit line is set to Vss. While the bit line is discharging, the node N3 of TDC is set to Vss to set the signal REG to the high level to turn on the transistor 61q. The data in DDC is thus transferred to TDC.

Then, the signal DTG is set to the high level to turn on the transistor 61s to transfer the data in PDC to DDC. The data in DDC is subsequently transferred to PDC. The signal BLPRE in the data storage circuit is then set to the voltage Vdd+Vth to turn on the transistor 61u to precharge the node N3 of TDC to Vdd. Subsequently, the signal BLCLAMP is set to, for example, (0.45 V+Vth) to turn on the transistor 61t. Then, the node N3 of TDC becomes at the low level if the bit line is at the low level. The node N3 of TDC becomes the high level if the bit line is at the high level.

Here, executing a write operation causes the low level to be stored in DDC. No executing a write operation causes the high level to be stored in DDC. Setting the signal VREG to Vdd to set the signal REG to the high level thus forcibly sets the node N3 of TDC to the high level only when a write operation is avoided. After this operation, the data in PDC is transferred to DDC, and the potential of TDC is loaded into PDC. The high level is latched in PDC only if a write operation is avoided and if the data "1" has been written to the memory cell with the cell threshold voltage having reached the verify voltage "b'". The low level is latched in PDC only if the cell threshold voltage has not reached the potential "b'" and if the data "2" and "3" is written to the memory cell.

(Verify (c')) (S26)

For the cell to which the data "2" is written, a first page write operation has been executed using the verify voltage "a'", which is lower than the original verify voltage "c'". A subsequent write operation on the adjacent cell may have raised the threshold voltage, which may have reached the original verify voltage "c'". Thus, first, verification for the data "2" is executed. This program verify operation applies the verify voltage "c'" to the selected word line.

First, Vread (for example, 5 V) is supplied to unselected word lines in the selected block. Vsg (Vdd+Vth, for example, 2.5 V+Vth) is supplied to the select gate SGD in the selected block. The signal BLCLAMP in the data storage circuit 10, shown in FIG. 7, is set to, for example, (1 V+Vth) and the signal REG is set to Vdd+Vth to precharge the bit line. If the data "0" and "3" have been written to the memory cell, DDC has been set to the low level. This prevents the bit line from being precharged. If the data "1" and "2" have been written to the memory cell, DDC has been set to the high level. This allows the bit line to be precharged.

Then, the source side select line SG2 of the NAND cell is set to Vdd. When the threshold voltage is higher than the potential "c'", the cell is off. The bit line thus remains at the high level. Further, when the threshold voltage is lower than the potential "c'", the cell is on. This sets the bit line to Vss. While the bit line is discharging, the node N3 of TDC is set to Vss. The signal REG is subsequently set to the high level to turn on the transistor 61q. The data in DDC is thus transferred to TDC.

Then, the signal DTG is set to Vdd+Vth to turn on the transistor 61s to transfer the data in PDC to DDC. The data in DDC is subsequently transferred to PDC.

Then, the signal VPRE is set to Vdd to set the signal BLPRE to Vdd+Vth to precharge the node N3 of TDC to Vdd. Subsequently, the signal BLCLAMP is set to, for example, (0.45 V+Vth) to turn on the transistor 61t. Then, the node N3 of TDC becomes the low level if the bit line is at the low level. The node N3 of TDC becomes the high level if the bit line is at the high level.

Here, executing a write operation causes the low level to be stored in DDC. No executing a write operation causes the high level to be stored in DDC. By setting the signal VREG to Vdd and setting the signal REG to Vdd+Vth, the node N3 of TDC forcibly becomes the high level only when a write operation is avoided.

Subsequently, the data in PDC is transferred to DDC, and the potential of TDC is loaded into PDC. The high level is latched in PDC only if a write operation is avoided and if the data "2" has been written to the memory cell with the cell threshold voltage having reached the verify voltage "c'". The low level is latched in PDC only if the cell threshold voltage has not reached the potential "c'" and if the data "1" and "3" have been written to the memory cell.

(Verify (c')) (S27)

This program verify operation supplies the verify voltage "d'" to the selected word line. In this state, first, Vread (for example, 5 V) is supplied to unselected word lines in the selected block. Vsg (Vdd+Vth, for example, 2.5 V+Vth) is supplied to the select gate SGD in the selected block. The signal BLCLAMP is set to, for example, (0.6 V+Vth) and BLPRE is set to Vdd+Vth to turn on the transistors 61t and 61u to precharge the bit line.

Then, the source side select line SG2 of the cell is set to Vdd. When the threshold voltage is higher than the potential "d'", the cell is off. The bit line thus remains at the high level. Further, when the threshold voltage is lower than the potential "d'", the cell is on. The bit line is thus set to Vss. While the bit line is discharging, the node N3 of TDC is set to Vss. The signal REG is set to the high level to turn on the transistor 61q. The data in DDC is thus transferred to TDC.

Then, the signal DTG is set to the high level to turn on the transistor 61s to transfer the data in PDC to DDC. The data in TDC is subsequently transferred to PDC. Then, the signal BLPRE is set to Vdd+Vth to turn on the transistor 61u to precharge the node N3 of TDC to Vdd. Subsequently, the signal BLCLAMP is set to, for example, (0.45 V+Vth) to turn on the transistor 61t. The node N3 of TDC becomes the low level if the bit line is at the low level. The node N3 of TDC becomes the high level if the bit line is at the high level.

Here, executing a write operation causes the low level to be stored in DDC. No executing a write operation causes the high level to be stored in DDC. The signal VREG is thus set to Vdd to set the signal REG to turn on the transistor 61q. Then, the node N3 of TDC is forcibly set to the high level only when a write operation is avoided. After this operation, the data in PDC is transferred to DDC, and the potential of TDC is loaded into PDC. The high level is latched in PDC only if a write operation is avoided and if the data "3" has been written to the memory cell with the cell threshold voltage having reached the verify voltage "d'". The low level is latched in PDC only if the cell threshold voltage has not reached the potential "d'" and if the data "1" and "2" have been written to the memory cell.

If the PDC is at the low level, a write operation is executed again. The program operation and verify operation are repeated until the data in PDC changes to the high level in all the data storage circuits (S28).

In the above program verify operation, three verify operations are executed after one program operation. However, in an initial program loop, the threshold voltage does not rise. Thus, the verification for the memory cell data "3" or the verification for the memory cell data "3" and "2" may be omitted. Further, a write operation for the memory cell data "1" or a write operation for the memory cell data "2" and "1" is finished before a program loop near the end of the process. These verify operations may thus be omitted. The omission of the verification for the memory cell data "1" eliminates the need to hold the data stored in SDC. This enables the next write data to be externally pre-loaded.

(Erase Operation)

An erase operation is executed on each block shown by the broken line in FIG. 4. The erase operation is simultaneously executed on the two bit lines (BLie and BLio) connected to each data storage circuit. After the erasure, the cell threshold value becomes the memory cell data "0" as shown in FIG. 9C.

With the RLSB or REASB method, the threshold voltage of the erase cell needs to be shallower. Accordingly, after the erase operation, all the word lines in the block is selected and a program operation and a program verify read operation are executed. As shown in FIG. 9C, a write operation is executed up to the verify level "z". In this case, the normal program operation and program verify read operation are executed except that all the word lines are selected and that for verification, the potential of the selected word line is set to z (for example, −3 V). The erased threshold voltage is thus programmed to set the threshold distribution narrower.

The above embodiment sets a plurality of threshold voltages including the data "0" for the negative side for voltages lower than 0 V. That is, the data "0" and "1" are set for the negative voltage side. Two data "2" and "3" may thus be set within the range of 0 V to Vread. This enables the threshold voltage distribution of each data to be widened. If during a program sequence, a program verify operation results in an insufficient write operation, a program verify operation and a program operation are repeated with the write voltage Vpgm incremented by ΔVpgm (very small Vpgm) for the next program operation. An increase in ΔVpgm enables a reduction in the number of program and verify operations but disadvantageously widens the threshold voltage distribution. However, the present embodiment allows the threshold voltage distribution to be widened. Thus, even with an increase in ΔVpgm, the number of program and verify operations can be reduced to increase the write speed.

To supply a negative voltage to the gate of the selected cell, the word line and the substrate 51 need to be set at the negative potential; a high-voltage N channel MOS transistor H. V. Tr. constituting the row decoder 6-1 is formed on the substrate 51, and the substrate 51 has a large capacitance. However, as shown in FIG. 1, the first embodiment forms the P well region 57 in the N well region 53; a low-voltage N channel MOS transistor L. V. Tr in the data storage circuit, having a large capacitance, is formed in the P well region 53. This inhibits an increase in the capacitance of the substrate 51. The substrate can thus be charged to the negative potential at a high speed, enabling a reduction in current consumption.

In a program sequence or a read sequence, the P type substrate 51 is set to a negative voltage for setups such as data transfers. This eliminates the need to charge the large-capacitance substrate 51 for each program operation, enabling a high speed write operation and a reduction in current consumption.

The REASB and RLSB schemes have been proposed to avoid the erroneous execution of a "1" write operation (non-write). To turn off a NAND string-like channel, the word line is set to Vss. However, if this cell is an erase cell, the threshold level is deeper on the negative side. Accordingly, the word line is set to a negative potential.

Further, as previously described, during a write operation, the write voltage Vpgm is supplied to each word line in the selected cell. Then, during a program verify operation, a write operation is repeated with the gradually incremented write voltage Vpgm until the threshold voltage of the selected cell reaches the predetermined value. As shown in FIG. 2B, the present embodiment can reduce the verify levels VC and VD slightly compared to those in the prior art shown in FIG. 2A. This advantageously enables a reduction in write voltage Vpgm and thus in the breakdown voltage of the peripheral circuit. Further, the size of the pump circuit generating a write voltage Vpgm can be reduced.

The above embodiment has been described in conduction with 2-bit 4-value data. However, the present invention is not limited to this. The present embodiment is applicable to 3-bit 8-value data, 4-bit 16-value data, or more-bit more-value data. For storage of such multivalue data, 4 of the 8 values or 8 of the 16 values may be set on the negative side.

Figure 15A:
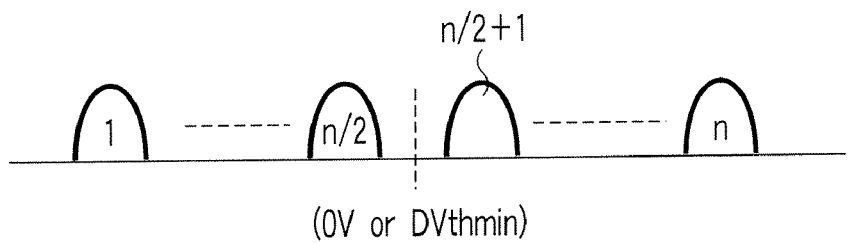
FIG. 15A is a diagram showing a modification of the first embodiment.

In the above embodiment, 0 V is set in a central part of a plurality of threshold voltage distributions corresponding to multivalue data. However, the present invention is not limited to this. As shown in FIG. 15A, for example, the central part of the multivalue data may be set for a threshold voltage DVthmin with the minimum data retention.

Figure 15B:
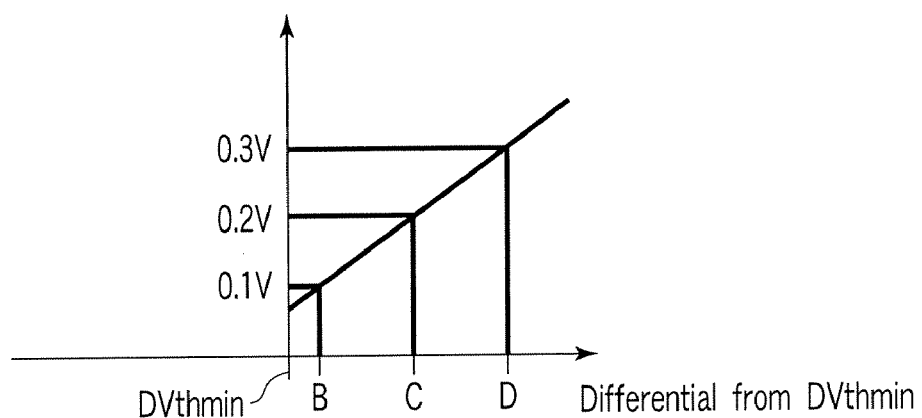
FIG. 15B is a diagram showing a conventional required data retention.

FIG. 15B shows the relationship between the required data retention and the differentials B, C, and D between each threshold voltage and the threshold voltage DVthmin with the minimum data retention. As shown in FIG. 15B, it is necessary to increase the set margin for the required data retention, that is, the set differentials VB-RB, VC-RC, and VD-RD between verify levels VB, VC, and VD and read levels RB, RC, and RD shown in FIGS. 2A and 2B, consistently with the value of the difference from the threshold voltage with the minimum data retention.

In the conventional technique shown FIG. 15B, VB-RB for the differential B from the threshold voltage with the minimum data retention is 0.1 V. VC-RC for the differential C is 0.2 V and VD-RD for the differential D is 0.3 V. The total of the differentials is 0.6 V. The conventional technique thus needs to set a margin of 0.6 V.

Figure 15C:
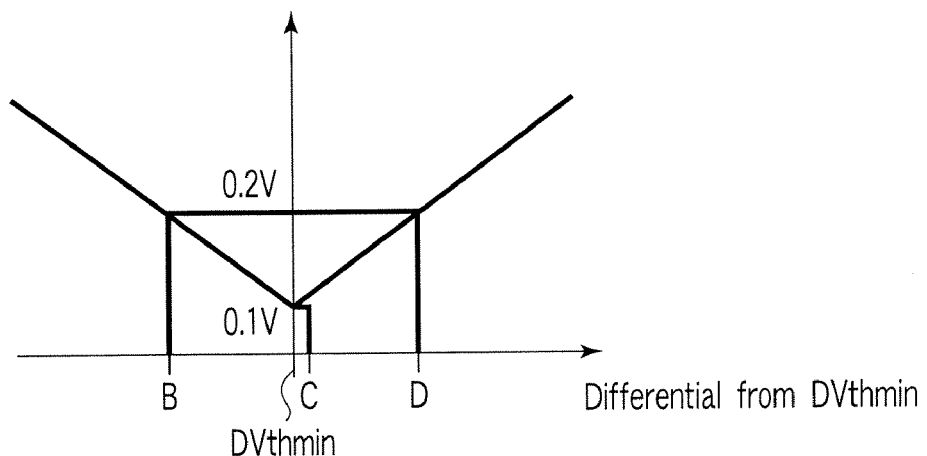
FIG. 15C is a diagram showing a required data retention according to the first embodiment.

In contrast, FIG. 15C relates to the present embodiment and shows the relationship between the required data retention and the threshold voltage. In FIG. 15C, VB-RB for the differential B is 0.2 V, VC-RC for the differential C is 0.1 V, and VD-RD for the differential D is 0.2 V. The total of the differentials is 0.5 V. The present embodiment thus has only to set a margin of 0.5 V.

The total margin can thus be reduced, allowing more data to be stored within the range of Vread.

Second Embodiment

In the first embodiment, as shown in FIG. 13, the second page write operation involves three verify operations, verify "b'", verify "c'", and verify "d'" for each program. The number of verify operations thus increases in keeping with the number of set threshold voltages, that is, as the number increases, for example, from 8 to 16. This disadvantageously reduces the write speed. The second embodiment thus reduces the number of verify operations to achieve high-speed write operations.

Figure 16:
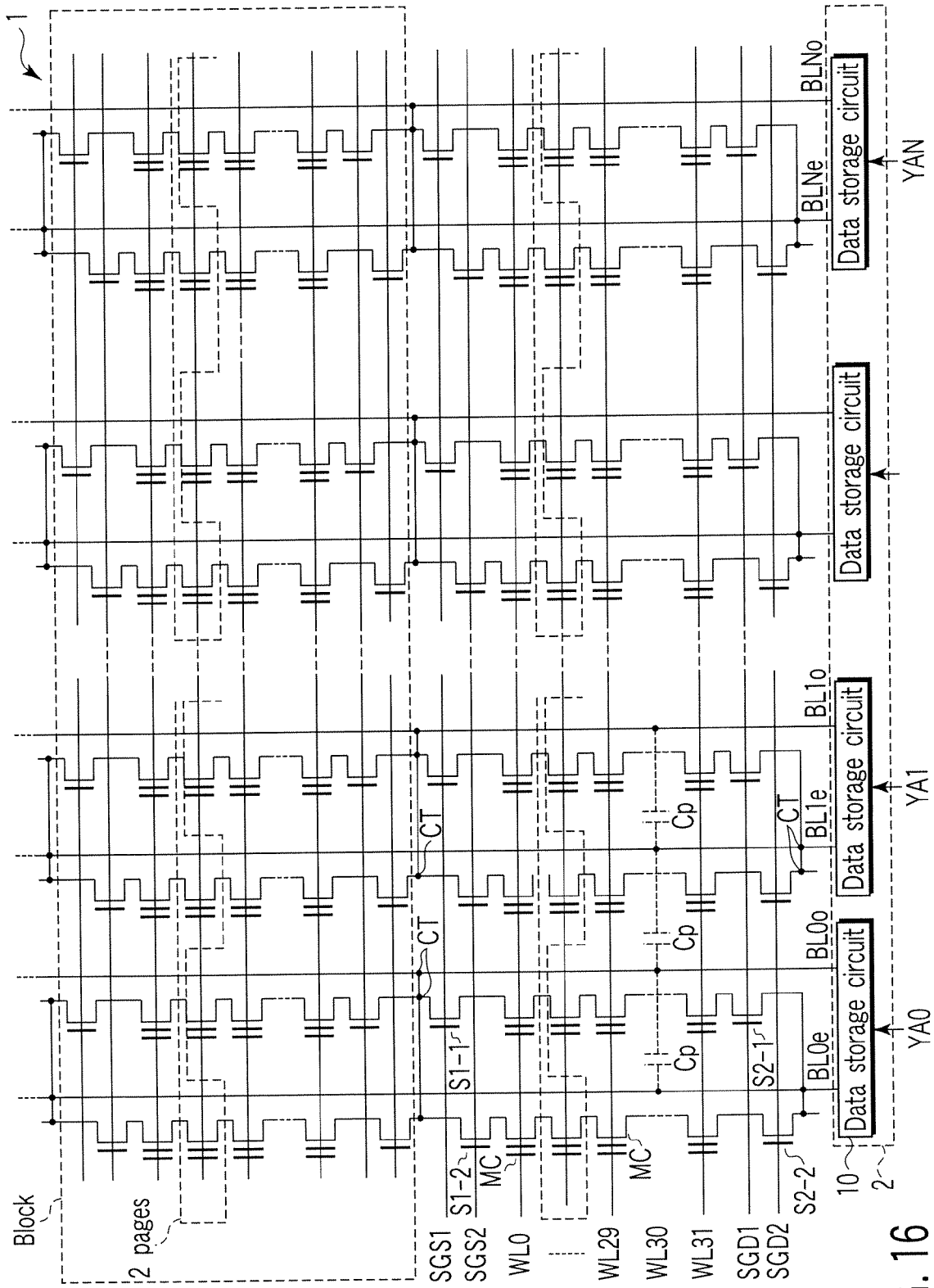
FIG. 16 is a circuit diagram showing the configuration of a memory cell array and a bit line control circuit according to a second embodiment.

FIG. 16 shows the circuit configuration of a memory cell array according to the second embodiment. This figure shows an example in which unselected bit lines are used as source lines. In this example, bit lines BL0o, BL1o to BLNo are used as source lines. The memory cell array shown in FIG. 16 thus has no such a source line SRC as shown in FIG. 4. However, the memory cell array has a select gate that connects one end of a selected NAND cell and a selected bit line together, and select gates connecting the other end of the selected NAND cell and the unselected bit lines together.

That is, select gates S1-1 and S1-2 are provided on the source side of the NAND cell. Select gates SGD1 and SGD2 are provided on the drain side of the NAND cell. All the gates of the select gates S1-1 are connected to the select line SGS 1. The gates of the select gates S1-2 are connected to the select line SGS2. The gates of the select gates S2-1 are connected to the select line SGD1. The gates of the select gates S2-2 are connected to the select line SGD2.

In this configuration, for example, to select the NAND cell shown to the right of each of the bit lines BL0e and BL1e to BLNe, the select line SGD1 is set to the high level to turn on the select gate S2-1. One end of the NAND cell is thus connected to the corresponding one of the bit lines BL0e and BL1e to BLNe. At the same time, the select line SGS1 is set to the high level to turn on the select gate S1-1. The other end of the NAND cell is thus connected to the corresponding one of the bit lines BL0o and BL1o to BLNo, serving as source lines.

For example, to select the NAND cell shown to the left of each of the bit lines BL0e and BL1e to BLNe, the select line SGD2 is set to the high level to turn on the select gate S2-2. One end of the NAND cell is thus connected to the corresponding one of the bit lines BL0e and BL1e to BLNe. At the same time, the select line SGS2 is set to the high level to turn on the select gate S1-2. The other end of the NAND cell is thus connected to the corresponding one of the bit lines BL0o and BL1o to BLNo, serving as source lines.

In contrast to the even-numbered bit lines BL0e and BL1e to BLKe, the odd-numbered bit lines BL0o and BL1o to BLko are source lines. Accordingly, the memory cells are selected in order of the word lines WL0 and WL1 to WL30, with data written to the selected memory cells.

The second embodiment can be implemented even if the threshold voltage is negative as is the case with the first embodiment. However, in the description below, the threshold voltage is positive for easy description.

It is assumed that a level A (a'=0.5 V) and a level B (b'=1.5 V) are written to a plurality of memory cells. In this case, the potential of the selected word line is set to b'=1.5 V. The unselected bit lines (source lines) corresponding to the cells to which the level A is written are supplied with the potential b'−a' (1 V). The unselected bit lines (source lines) corresponding to the cells to which the level B is written are supplied with the potential 0 V. Subsequently, the selected bit lines (cell drains) corresponding to the cells to which the level A is being written are supplied with a potential b'−0a'+Vpre (0.6 V)=1.6 V. The selected bit lines (cell drains) corresponding to the cells to which the level B is being written are supplied with a potential Vpre (0.6 V).

At this time, one of the cell drain-side select lines SGD1 and SGD2 and one of the cell source-side select lines SGS1 and SGS2 are selected as described above. This enables the plurality of levels to be read during a single verify read operation.

Figure 17:
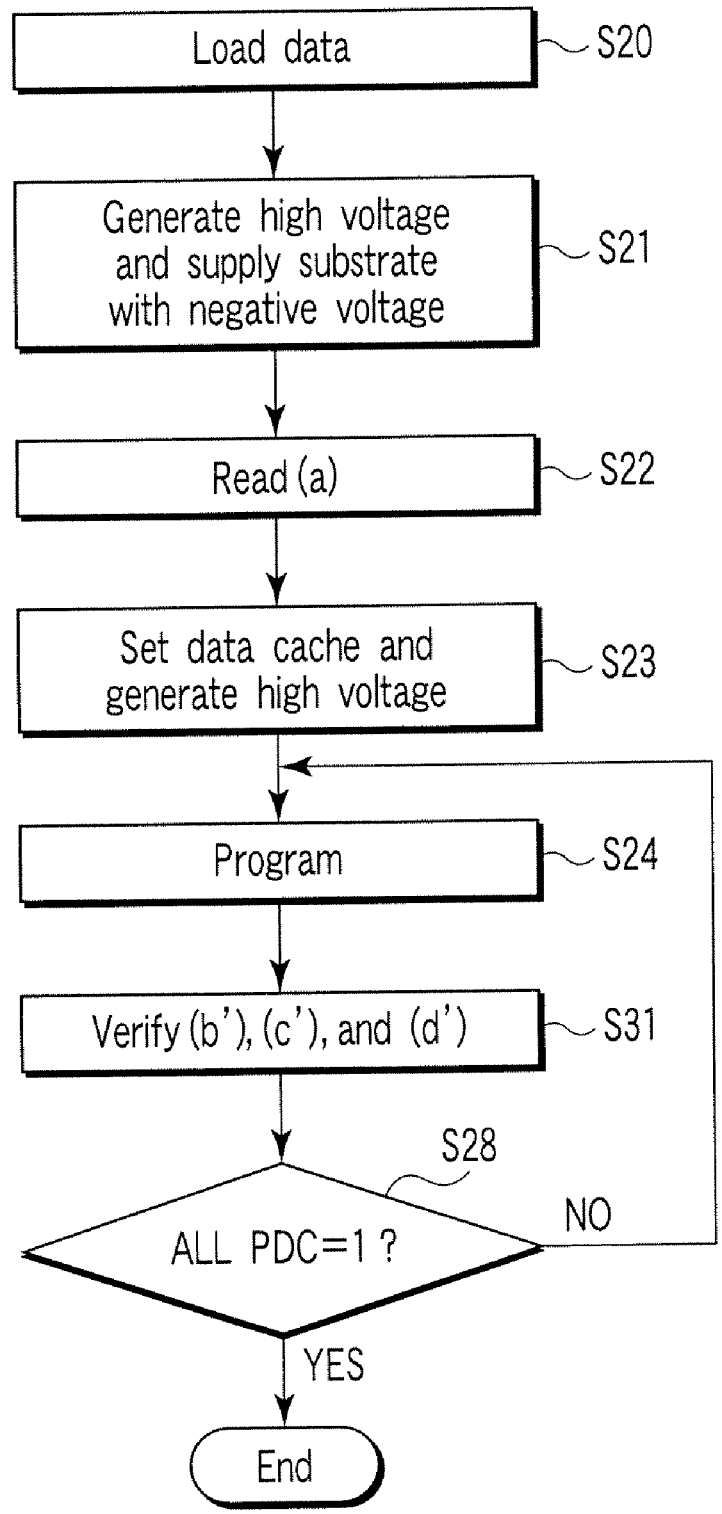
FIG. 17 is a flowchart showing a second write operation according to a second embodiment.

FIG. 17 shows an example of a program sequence in which step 31 executes three verify operations, verify (b'), verify (c'), and verify (d') at a time.

Figure 18:
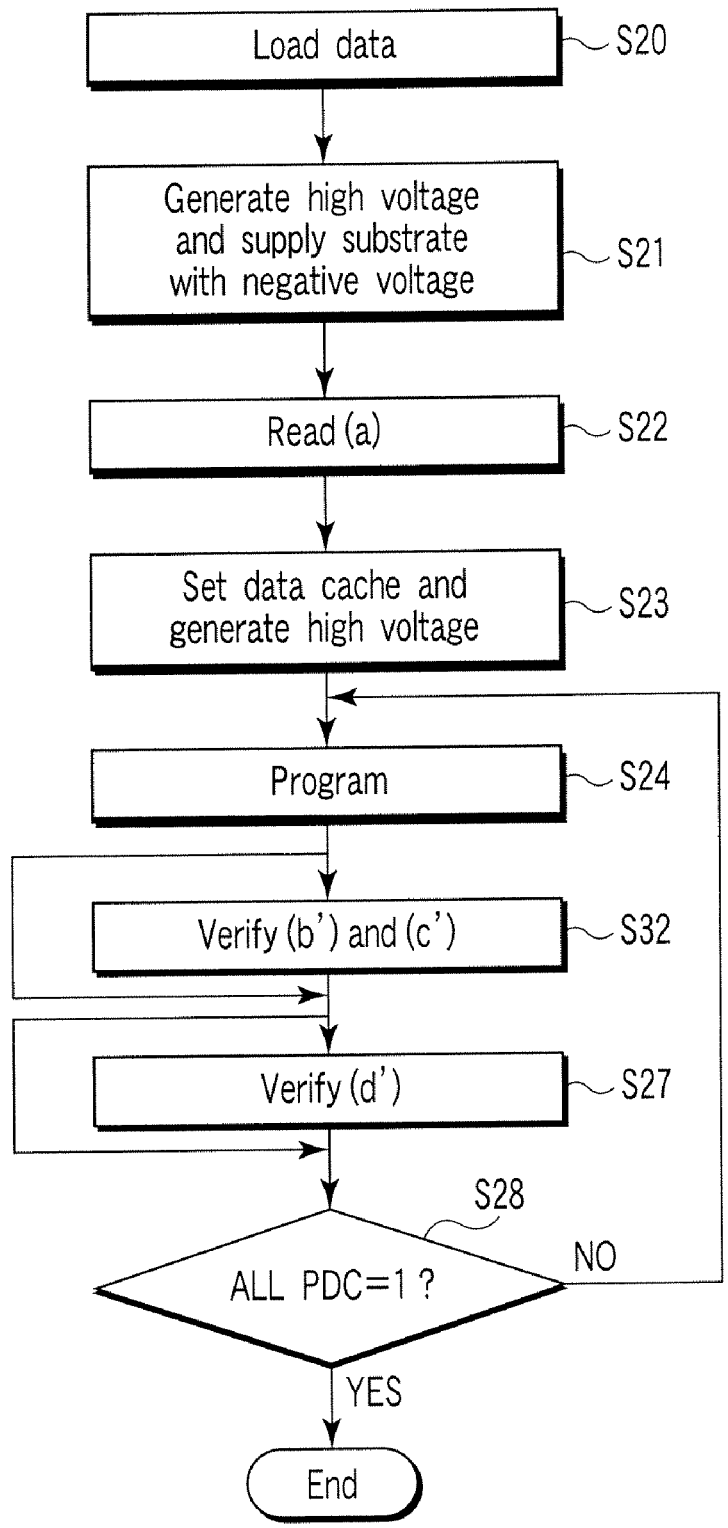
FIG. 18 is a flowchart showing a modification of FIG. 17.

FIG. 18 shows an example of a program sequence in which step 32 executes two verify operations, verify (b') and verify (c') at a time.

In FIGS. 17 and 18, the same components as those in FIG. 13 are denoted by the same reference numerals.

Figure 19:
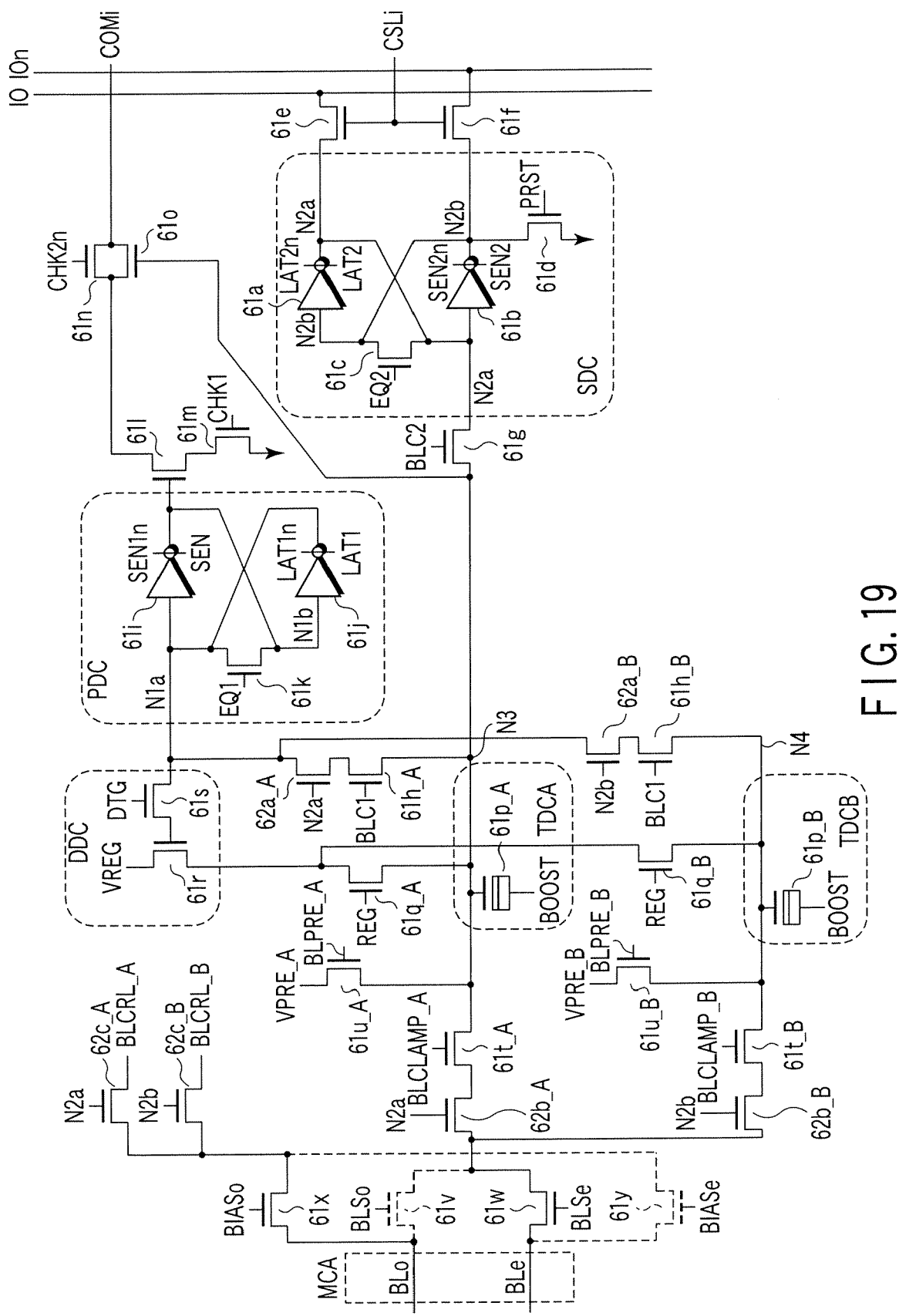
FIG. 19 is a circuit diagram showing an example of a data storage circuit according to a second embodiment.

FIG. 19 shows an example of the data storage circuit 10 applied to the second embodiment. In FIG. 19, the same components as those in FIG. 7 are denoted by the same reference numerals. The data storage circuit 10 in FIG. 19 is the same as that in FIG. 7 except that it has TDCA and TDCB that hold voltages read from selected bit lines and that the bit line BLo of the pair of bit lines BLe and BLo is used as a source line.

In FIG. 19, TDCA is connected to the transistor 61w connected to the bit line BLe via transistors 61t_A and 62b_A. A gate of the transistor 61t_A is supplied with a signal BLCLAMP_A. A gate of the transistor 62b_A is connected to the node N2b of SDC. TDCA is composed of a MOS capacitor 61p_A. One end of the capacitor 61p_A is connected to the connection node N3, with the other end supplied with a signal BOOST. The connection node N3 is connected to the node N1a of PDC via transistors 61h_A and 62a_A. A gate of the transistor 61h_A is supplied with a signal BLC1. A gate of the transistor 62a_A is connected to the node N2a of SDC. The connection node N3 is connected to a transistor 61r constituting DDC, via a transistor 61q_A. A gate of the transistor 61q_A is supplied with the signal REG. One end of a current path through a transistor 61u_A is connected to the connection node N3. The other end of the current path through the transistor 61u_A is supplied with a signal VPRE_A. A gate of the transistor 61u_A is supplied with a signal BLPRE_A.

TDCB is connected to the transistor 61w connected to the bit line BLe via transistors 61t_B and 62b_B. A gate of the transistor 61t_B is supplied with a signal BLCLAMP_B. A gate of the transistor 62b_B is connected to the node N2b of SDC. TDCB is composed of a MOS capacitor 61p_B. One end of the capacitor 61p_B is connected to a connection node N4, with the other end supplied with the signal BOOST. The connection node N4 is connected to the node N1a of PDC via transistors 61h_B and 62a_B. A gate of the transistor 61h_B is supplied with the signal BLC1. A gate of the transistor 62a_B is connected to the node N2b of SDC. The connection node N4 is connected to the transistor 61r, constituting DDC, via a transistor 61q_B. A gate of the transistor 61q_B is supplied with the signal REG. One end of a current path through a transistor 61u_B is connected to the connection node N4. The other end of the current path through the transistor 61u_B is supplied with a signal VPRE_B. A gate of the transistor 61u_B is supplied with a signal BLPRE_B.

The transistor 61x having one end connected to the bit line BLo, serving as the source line SRC, has the other end connected to one end of transistors 62c_A and 62c_B. The other end of the transistor 62c_A is supplied with a voltage BLCRL_A. A gate of the transistor 62c_A is connected to the node N2a of SDC. The other end of the transistor 62c_B is supplied with a voltage BLCRL_B. A gate of the transistor 62c_B is connected to the node N2b of SDC. The transistors 62c_A and 62c_B constitute a charging path for the bit line BLo, serving as a source line. The voltages BLCRL_A and BLCRL_B are generated by the control signal and control voltage generating circuit 7. The voltages BLCRL_A and BLCRL_B are set at, for example, b'−a' (1 V) or 0 V.

The above configuration has a charging path for the unselected bit line in each data storage circuit 10. The bit line BLo, serving as the source line SRC, can thus be supplied with a plurality of potentials, for example, b'−a' (1 V) or 0 V. The selected bit line (cell drain) can also be supplied with a plurality of potentials, for example, b'−a'+Vpre (1.6 V) or Vpre (0.6 V).

In the above configuration, to write the level A to the memory cell, the nodes N2a and N2b of SDC are set to the high level and low level, respectively. To write the level B to the memory cell, the nodes N2a and N2b of SDC are set to the low level and high level, respectively. This sets the transistors 62a_A, 62a_B, 62b_A, 62b_B, 62c_A, and 62c_B on or off depending on the levels of the nodes N2a and N2b of SDC. In this state, each potential is supplied to the bit line.

To write the data "1" (non-write data) to the cell connected to word line WL0, the word line WL0 is set to Vpgm and the select lines SGS1 and SGS2 are set to Vss. Then, the bit line is set to Vdd and the cell channel is booted and set to a high potential. However, since the select line SGS2 is at Vss, GIDL (Gate Induced Drain Leakage) may disadvantageously occur at the select gate S1-2 to cause an erroneous write operation to be executed on the cell connected to the word line WL0. The select line SGS2 is thus set to Vdd or the intermediate potential to ease electric fields. Alternatively, during programming, the select lines SGS1 and SGS2 are set to Vdd to provide the unselected bit line BLo with the same potential as that of the selected bit line BLe. In this case, the data storage circuit shown in FIG. 19 has an additional transistor 61v having a gate to which a signal BLSO is input as shown by a dotted line. Via the transistor 61v, the same potential as that of the selected bit line BLe is supplied to the bit line BLo.

Further, in a verify read operation for the level A, turning off the cell sets the potential of the bit line to b'-a'+Vpre (1.6 V). Turning off the cell sets the potential of the bit line to b'-a' (1.0 V). In a verify read operation for the level B, turning off the cell sets the potential of the bit line to Vpre (0.6 V). Turning off the cell sets the potential of the bit line to 0 V.

To read the potential of the bit line to PDC, for example, the signals VPRE_A and VPRE_B are set to Vdd to turn on the transistors 61u_A and 61u_B. TDCA and TDCB are thus set to Vdd. The signal BOOST is subsequently set to the high level to increase the voltages of TDCA and TDCB closer to 2Vdd. Then, the signal BLCLAMPA is set to b'-a'+Vsen+Vth (1.4 V+Vth). The signal BLCLAMPB is set to Vsen+Vth (0.4 V+Vth). As a result, the high-level bit line allows TDCA and TDCB to remain at 2Vdd. The low-level bit line sets TDCA and TDCB to the low level. The signal BOOST is subsequently lowered to set the signal BLC1 to the high level. The data in TDCA and TDCB is then transferred to PDC. That is, if the level A can be sufficiently written, the high level in TDCA is transferred to PDC. If the level B can be sufficiently written, the high level in TDCB is transferred to PDC.

If the level A cannot be sufficiently written, the low level in TDCA is transferred to PDC. If the level B cannot be sufficiently written, the low level in TDCB is transferred to PDC.

Furthermore, for a read operation, the P-type well region, the substrate for the memory cells, is set to the ground potential Vss as is the case with the first embodiment. However, the second embodiment provides the unselected bit line (source) with the potential, applying back bias to the memory cell. Therefore, this needs to be avoided.

Figure 20:
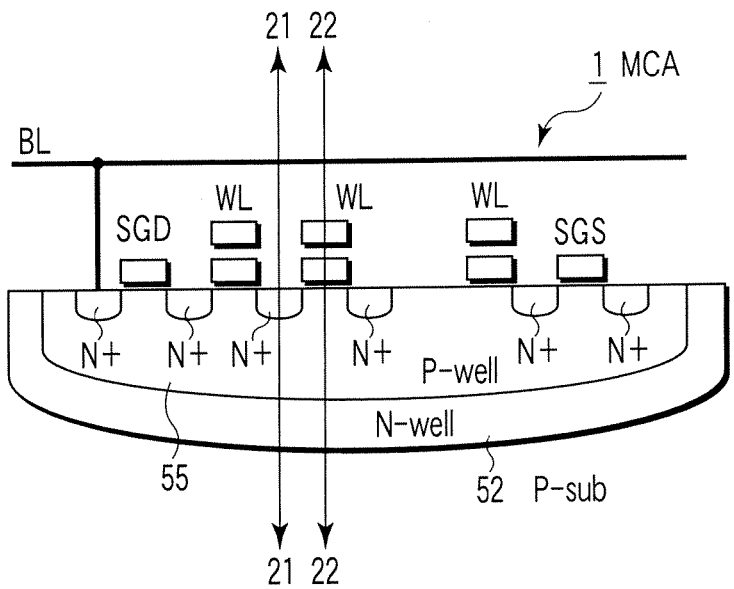
FIG. 20 is a sectional view of a memory cell array according to a second embodiment.
Figure 21:
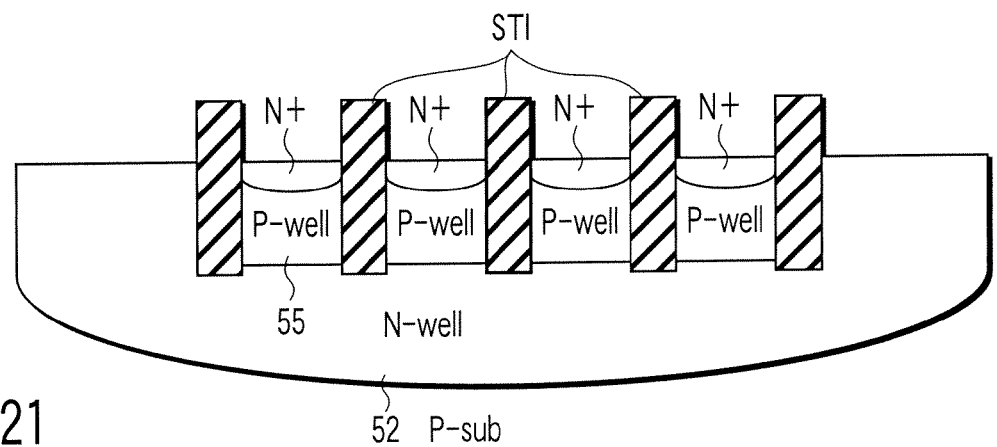
FIG. 21 is a sectional view taken along line 21-21 in FIG. 20.
Figure 22:
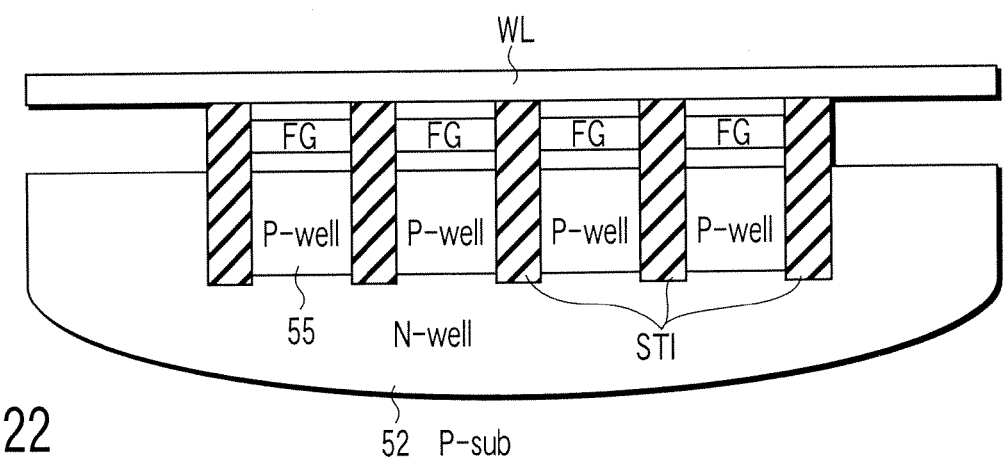
FIG. 22 is a sectional view taken along line 22-22 in FIG. 20.

FIGS. 20, 21, and 22 show sectional views of a memory cell array according to a second embodiment. As shown in FIGS. 20, 21, and 22, STIs (Shallow Trench Isolations) each formed between the memory cells MC as isolation regions are formed deeper than the P well region 55 to separate the P well region 55 into NAND cells (bit lines). The back bias on the memory cell array can be eliminated by applying the same potential as that of the unselected bit line (source) to the P well region 55 in each NAND cell.

In the circuit configuration shown in FIG. 16, the select gates S1-1, S1-2, S2-1, and S2-2 controls the connection of the pair of bit lines, for example, the bit lines BL0e and BL0o, to the single data storage circuit 10, with the unselected bit line used as a source line. However, a narrow spacing between the adjacent bit lines makes it difficult to form a contact CT that connects the bit line to a diffusion layer.

Figure 23:
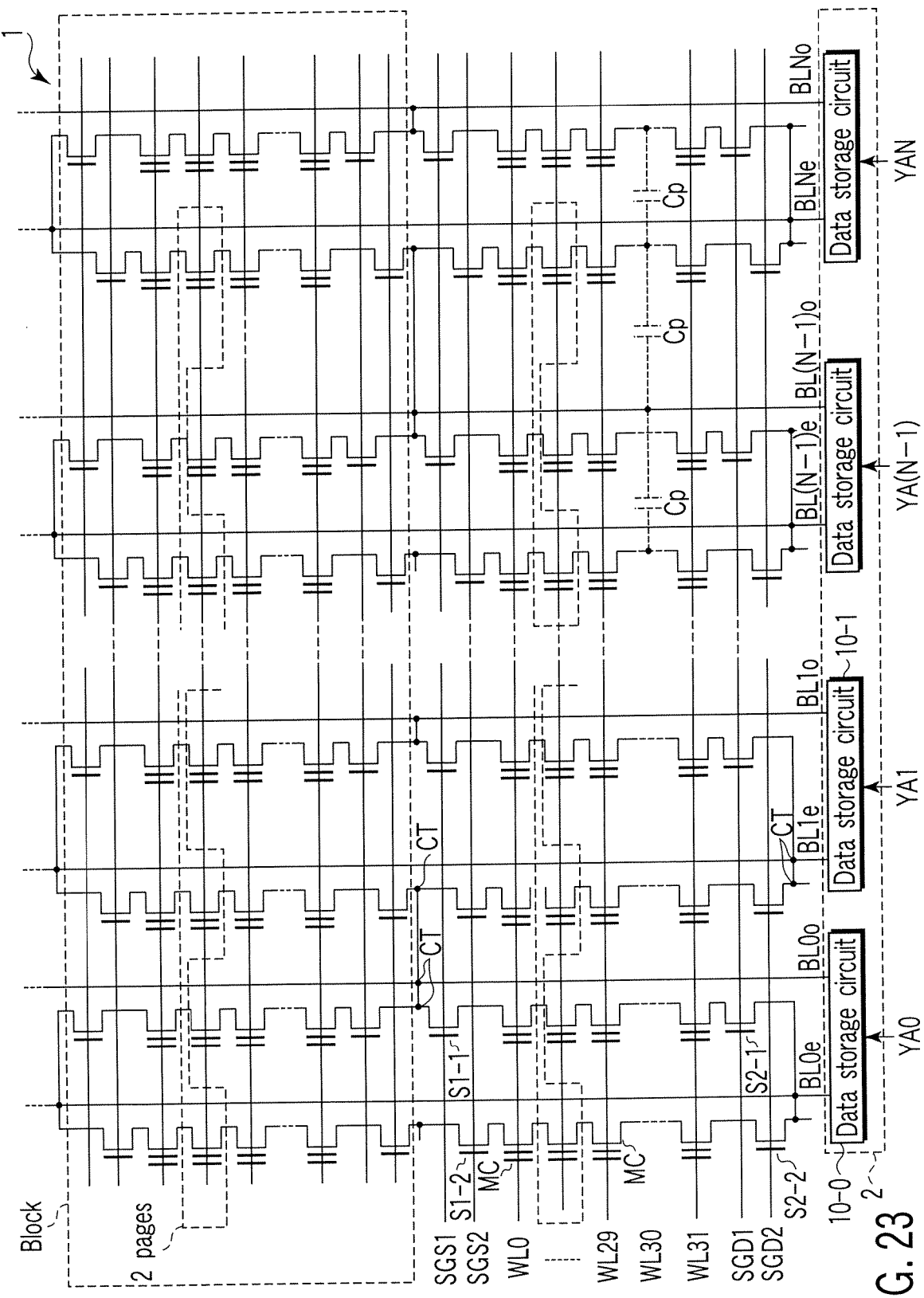
FIG. 23 is circuit diagram showing a modification of FIG. 16.

FIG. 23 shows a modification of FIG. 16 which facilitates the formation of a contact CT. In FIG. 23, the same components as those in FIG. 16 are denoted by the same reference numerals.

In FIG. 23, the contacts CT, each of which connects the bit line and diffusion layer together, are alternately arranged at one end or the other end of the NAND cell for each bit line. That is, for the bit lines BL0e . . . BL (N−1)e, and BLNe, the contact CT is connected to the diffusion layer of the select gate S2-2. For the bit lines BL0o . . . BL (N−1)o, and BLNo, the contact CT is connected to the diffusion layer of the select gate S1-1.

In the above configuration, the select gates S1-1, S1-2, S2-1, and S2-2 use the unselected bit line connected to the adjacent data storage circuit 10 as a source line. Specifically, if the select line SGD1 is at the high level, the select line SGD2 is at the low level, the select line SGS1 is at the high level, and the select line SGS2 is at the low level, then the select gate S2-1 is on, the select gate S2-2 is off, the select gate S1-1 is on, and the select gate S1-2 is off. Thus, for a data storage circuit 10-0, the bit line BL0o is selected, and the unselected bit line BL1e connected to a data storage circuit 10-1 is used as a source line.

If the select line SGD1 is at the low level, the select line SGD2 is at the high level, the select line SGS1 is at the low level, and the select line SGS2 is at the high level, then the select gate S2-1 is off, the select gate S2-2 is on, the select gate S1-1 is off, and the select gate S1-2 is on. Thus, for the data storage circuit 10-1, the bit line BL1e is selected, and the unselected bit line BL1o connected to the data storage circuit 10-0 is used as a source line.

In the configuration shown in FIG. 23, for the adjacent bit lines, the contacts, each of which connects the diffusion layer and bit line together, are alternately arranged at one end or the other end of the NAND cell. Consequently, even with a narrow spacing between the bit lines, the contact for the bit line and diffusion layer can be easily formed. A margin for contact arrangement can thus be reduced. This is advantageous for reducing the size of elements.

In FIG. 16, if for example, the bit line BLNe is precharged and the bit line BLNo is used as a source line to read the potential of the cell in the on state, the potential of the bit line BLNe lowers from Vpre (0.6 V) to Vss (0 V) or from b'-a'+Vpre (1.6 V) to b'-a' (1 V). At this time, coupling of the capacitances Cp of the adjacent bit lines may lower the potential of the adjacent bit line BL (N−1) o.

Thus, instead of being temporarily precharged, the bit line BL0e is always charged to keep its potential at Vpre (0.6 V) or b'-a'+Vpre (1.6 V). This configuration causes a current to flow into the control signal and control voltage generating circuit 7, which is connected to the bit line serving as a source line to supply the voltage Vss (0 V) or b'-a' (1 V). However, the data can be read by, for example, ensuring the time required to stabilize the current, or first reading data from the cells through which large currents flow, then executing a reading operation on the cells other than those through which large currents flow, that is, the calls with smaller currents, and repeating this operation.

In FIG. 16, the bit lines BL0o, BL2o, and BL4o are used as source lines to read data from the bit lines BL0e, BL2e, BL4e, . . . , respectively. However, a fixed potential (for example, 0 V) may be applied to the adjacent bit lines BL1e and BL1o, BL3e and BL3o, BL5e and BL5o, . . . and used as shields to inhibit coupling. In this case, each of the data storage circuits shown in FIG. 16 is connected to a set of four bit lines.

The second embodiment uses the adjacent unselected bit line as a source line, and if the level B is to be written to the cell, the source line is supplied with the ground potential. If the level A (<B) is to be written to the cell, the source line is supplied with the potential B−A, the select bit line corresponding to the cell to which the level B is being written is supplied with Vpre, and the select bit line to which the level A is to be written is supplied with the potential B−A+Vpre to set the selected word line to the potential B. Further, the data storage circuit 10 has TDCA and TDCB and switches them on the basis of the data stored in SDC. This makes it possible to simultaneously verify the plurality of threshold voltages to be written to the memory cells. Therefore, required verify operations can be reduced, enabling an increase in write speed.

In the second embodiment, the odd-numbered bit line BL0o and BL1o to BLko and the even-numbered bit lines BL0e and BL1e to BLke can be selectively used as source lines. In this case, in the configuration shown in FIG. 16, to select, for example, the bit line BL0o, the select line SGS1 is set to the high level to turn on the select gate S1-1. One end of the NAND cell is thus connected to the bit line BL0o. At the same time, the select line SGD1 is set to the high level to turn on the select gate S2-1. The other end of the NAND cell is thus connected to the unselected bit line BL0e. The unselected bit line BL0e operates as a source line. In this case, the memory cells are selected in order of the word lines WL31 and WL30 to WL0, with data written to the selected memory cells.

If for example, the bit line BLOe is selected, the select line SGD2 is set to the high level to turn on the select gate S2-2. One end of the NAND cell is thus connected to the bit line BL0e. At the same time, the select line SGS2 is set to the high level to turn on the select gate S1-2. The other end of the NAND cell is thus connected to the unselected bit line BL0o. The unselected bit line BL0o operates as a source line.

In this case, as shown by a broken line in FIG. 19, the data storage circuit may be provided with the transistor 61v connecting the bit line BL0o to the data storage circuit 10 and the transistor 61y connecting the bit line BL0e to a bit line charging circuit. The voltages BLCRL_A and BLCRL_B may then be selectively supplied to the odd- or even-numbered bit lines by the transistors 62c_A, 62c_B, and 61x, and 61y.

In the second embodiment, Verification of two levels is performed by one verify operation. However, it is not limited to this. In case of four levels, for example, it is possible to verify simultaneously three levels, four levels, or a number level. Furthermore, in the case of eight values, it is also possible to verify simultaneously seven levels, eight levels, or a number level, and to verify simultaneously 15 levels, 16 levels, or a number level in the case of 16 values.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory cell array having word lines and bit lines and in which a plurality of series connected memory cells are arranged in a matrix, one of a plurality of threshold voltages being set for each of the memory cells;
a select transistor which selects from the word lines; and
a control circuit which controls potentials of the word lines and bit lines in accordance with input data, the control circuit controlling a data write operation, a data read operation, and a data erase operation executed on the memory cells,
wherein the select transistor is formed on a substrate, and for a read operation, the substrate is supplied with a first negative voltage, a selected word line is supplied with a first voltage (first voltage≧first negative voltage), and unselected word lines are supplied with a second voltage.

2. The device according to claim 1, wherein a part of the control circuit is formed in an N-type well region formed in the substrate of a P type and in a P-type well region formed in the N-type well region.

3. The device according to claim 1, wherein the control circuit comprises:
a pump circuit which generates a negative voltage in response to a clock signal;
a detection circuit connected to an output end of the pump circuit, the detection circuit detecting an output voltage from the pump circuit;
an oscillator which generates the clock signal; and
a control section to which an output signal from the detection circuit is supplied, the control section controlling the oscillator in accordance with the output signal from the detection circuit.

4. The device according to claim 1, wherein each of the memory cells stores one of a plurality of threshold voltages, and some of the plurality of threshold voltages are negative.

5. The device according to claim 1, wherein a central part of the plurality of threshold voltages is 0 V.

6. The device according to claim 1, wherein a central part of the plurality of threshold voltages is a threshold voltage with a minimum data retention.

7. A semiconductor memory device comprising:
a memory cell array having word lines and bit lines and in which a plurality of series connected memory cells are arranged in a matrix, one of a plurality of threshold voltages being set for each of the memory cells;
a select transistor which selects from the word lines; and
a control circuit which controls potentials of the word lines and bit lines in accordance with input data to control a data write operation, a data read operation, and a data erase operation executed on the memory cells,
wherein the select transistor is formed on a substrate, and for a write operation, the substrate is supplied with a second negative voltage, and a part of unselected word lines are supplied with a third voltage (third voltage≧second negative voltage).

8. The device according to claim 7, wherein the control circuit supplies the third voltage to unselected word lines located at least closer to a source line than a write target memory cell.

9. The device according to claim 7, wherein a part of the control circuit is formed in an N-type well region formed in the substrate of a P type and in a P-type well region formed in the N-type well region.

10. The device according to claim 7, wherein each of the memory cells stores one of a plurality of threshold voltages, and some of the plurality of threshold voltages are negative.

11. A semiconductor memory device comprising:
a memory cell array in which a plurality of series connected memory cells connected to word lines and bit lines and for each of which one of a plurality of threshold voltages is set are arranged in a matrix;
a select transistor which selects from the word lines; and
a control circuit which controls potentials of the word lines and bit lines in accordance with input data to control a data write operation, a data read operation, and a data erase operation executed on the memory cells, wherein the select transistor is formed on a substrate, and for an erase verify read operation, the substrate is supplied with a third negative voltage, and a selected word line is supplied with a fourth voltage (fourth voltage≧third negative voltage).

12. The device according to claim 11, wherein a part of the control circuit is formed in an N-type well region formed in the substrate of a P type and in a P-type well region formed in the N-type well region.

13. The device according to claim 11, wherein each of the memory cells stores one of a plurality of threshold voltages, and some of the plurality of threshold voltages are negative.

14. A semiconductor memory device comprising:
a memory cell array in which a plurality of series connected memory cells connected to word lines and bit lines are arranged in a matrix;
a control section which supplies a first voltage to a first bit line of the bit lines corresponding to a first memory cell to which a first threshold voltage is written, the control section supplying a second bit line corresponding to a second memory cell to which a second threshold voltage lower than the first threshold voltage is written, with a voltage obtained by adding the first voltage to a difference voltage between the first threshold voltage and the second threshold voltage, the control section supplying a third bit line connected as the source line and corresponding to the first memory cell, with a second voltage lower than the first voltage, the control section supplying a fourth bit line connected as the source line and corresponding to the second memory cell, with a voltage obtained by adding the second voltage to the difference voltage between the first threshold voltage and the second threshold voltage;
a first data storage circuit which detects and holds the potential of the first bit line during a write data verify operation; and
a second data storage circuit which detects and holds the potential of the second bit line during the write data verify operation.

15. The device according to claim 14, wherein the control section supplies a selected word line with the first threshold voltage.

16. The device according to claim 14, wherein the second voltage is a ground potential.

17. The device according to claim 14, further comprising:
a first selection circuit which connects one of the two adjacent bit lines to one end of the plurality of series connected memory cells in accordance with a first selection signal; and
a second selection circuit which connects the other of the two adjacent bit lines to the other end of the plurality of series connected memory cells as a source line, in accordance with a second selection signal.

18. The device according to claim 14, wherein each of the memory cells stores one of a plurality of threshold voltages, and some of the plurality of threshold voltages are negative.

19. The device according to claim 14, wherein an unselected one of the plurality of bit lines functions as a source line.

20. The device according to claim 14, further comprising:
an NAND cell including the memory cell;
a first contact connecting a first bit line with one end of the NAND cell; and
a second contact connecting a second bit line with another end of the NAND cell;
wherein the first and second contacts are spaced and arranged in longitudinal direction of the first and second bit lines.

* * * * *